United States Patent
Kim et al.

(10) Patent No.: US 11,482,522 B2
(45) Date of Patent: Oct. 25, 2022

(54) SEMICONDUCTOR DEVICES INCLUDING A NARROW ACTIVE PATTERN

(71) Applicants: Samsung Electronics Co., Ltd., Suwon-si (KR); Seoul National University R&DB Foundation, Seoul (KR)

(72) Inventors: Mun Hyeon Kim, Hwaseong-si (KR); Byung Gook Park, Seoul (KR); Keun Hwi Cho, Seoul (KR); Si Hyun Kim, Seoul (KR); Ki Tae Lee, Seoul (KR)

(73) Assignees: Samsung Electronics Co., Ltd.; Seoul National University R&DB Foundation

( * ) Notice: Subject to any disclaimer, the term of this patent is extended or adjusted under 35 U.S.C. 154(b) by 116 days.

(21) Appl. No.: 16/583,322

(22) Filed: Sep. 26, 2019

(65) Prior Publication Data
US 2020/0111781 A1  Apr. 9, 2020

(30) Foreign Application Priority Data

Oct. 8, 2018  (KR) .................. 10-2018-0120068
Jan. 9, 2019   (KR) .................. 10-2019-0002767

(51) Int. Cl.
| | | |
|---|---|---|
| *H01L 27/088* | (2006.01) | |
| *H01L 29/10* | (2006.01) | |
| *H01L 29/08* | (2006.01) | |
| *H01L 29/06* | (2006.01) | |
| *H01L 29/78* | (2006.01) | |
| *H01L 29/423* | (2006.01) | |
| *H01L 29/66* | (2006.01) | |
| *H01L 21/8234* | (2006.01) | |
| *H01L 21/306* | (2006.01) | |

(52) U.S. Cl.
CPC .... *H01L 27/0886* (2013.01); *H01L 21/30604* (2013.01); *H01L 21/823412* (2013.01); *H01L 21/823418* (2013.01); *H01L 21/823431* (2013.01); *H01L 21/823437* (2013.01); *H01L 29/0673* (2013.01); *H01L 29/0847* (2013.01); *H01L 29/1037* (2013.01); *H01L 29/42392* (2013.01); *H01L 29/6656* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | |
|---|---|---|
| 9,219,154 B1 | 12/2015 | Cheng et al. |
| 9,257,450 B2 | 2/2016 | Loubet et al. |
| 9,608,116 B2 | 3/2017 | Ching et al. |
| 9,653,480 B1 | 5/2017 | Cheng et al. |
| 9,691,851 B1 | 6/2017 | Fung |

(Continued)

*Primary Examiner* — Michelle Mandala
*Assistant Examiner* — Jordan M Klein
(74) *Attorney, Agent, or Firm* — Myers Bigel, P.A.

(57) ABSTRACT

Semiconductor devices are provided. A semiconductor device includes a gate structure extending in a first direction. The semiconductor device includes an active pattern intersecting the gate structure and having a width in the first direction and a height in a second direction. The width is smaller than the height. Moreover, the semiconductor device includes a source/drain region electrically connected to the active pattern.

20 Claims, 42 Drawing Sheets

(56) References Cited

U.S. PATENT DOCUMENTS

| | | | |
|---|---|---|---|
| 9,716,145 | B2 | 7/2017 | Balakrishnan et al. |
| 9,755,017 | B1 | 9/2017 | Guillorn et al. |
| 9,853,114 | B1 | 12/2017 | Rodder et al. |
| 10,014,390 | B1 | 7/2018 | Bouche et al. |
| 10,032,678 | B2 | 7/2018 | Xu et al. |
| 10,243,054 | B1* | 3/2019 | Cheng .................. H01L 27/088 |
| 2014/0097502 | A1* | 4/2014 | Sun .................. H01L 21/02532 257/392 |
| 2017/0018462 | A1* | 1/2017 | Suk .................... H01L 27/1211 |
| 2017/0104060 | A1* | 4/2017 | Balakrishnan ........ H01L 29/495 |
| 2017/0140933 | A1* | 5/2017 | Lee .................... H01L 29/0649 |
| 2017/0170268 | A1* | 6/2017 | Song .................... H01L 29/775 |
| 2018/0248046 | A1 | 8/2018 | Wu et al. |
| 2018/0254348 | A1 | 9/2018 | Ching et al. |
| 2018/0277448 | A1* | 9/2018 | Chen ................ H01L 21/823807 |
| 2019/0386011 | A1* | 12/2019 | Weckx ............. H01L 29/42392 |
| 2020/0066872 | A1* | 2/2020 | Lin .................... H01L 21/0234 |

\* cited by examiner

SEMICONDUCTOR DEVICES INCLUDING A NARROW ACTIVE PATTERN

CROSS-REFERENCE TO RELATED APPLICATION

This application claims priority to Korean Patent Application No. 10-2018-0120068, filed on Oct. 8, 2018 and Korean Patent Application No. 10-2019-0002767 filed on Jan. 9, 2019 in the Korean Intellectual Property Office, the disclosure of which is incorporated by reference herein in its entirety.

BACKGROUND

1. Field of the Invention

The present inventive concepts relate to semiconductor devices.

2. Description of the Related Art

Proposed scaling techniques for increasing the density of a semiconductor device have included a multi-gate transistor, a multi-bridge channel element, and a nanosheet element in which a nanowire-shaped silicon body is formed on a substrate and a gate is formed to surround the silicon body. Since the multi-gate transistor, the multi-bridge channel element, and the nanosheet element utilize three-dimensional channels, scaling may be easily performed. In addition, even if a gate length of the multi-gate transistor is not increased, the current control capability may be improved.

SUMMARY

Aspects of the present inventive concepts provide a semiconductor device in which a delay time is reduced and performance is improved.

Aspects of the present inventive concepts also provide a semiconductor device with an improved degree of integration.

Aspects of the present inventive concepts also provide a semiconductor device having various driving currents.

According to embodiments of the present inventive concepts, a semiconductor device may include a first gate structure extending in a first direction, in a first region. The semiconductor device may include a first active pattern penetrating through the first gate structure and having a first width in the first direction and a first height in a second direction. The first width may be smaller than the first height. The semiconductor device may include a first source/drain region electrically connected to the first active pattern. The semiconductor device may include a second gate structure extending in a third direction, in a second region. The semiconductor device may include a second active pattern penetrating through the second gate structure and having a second width in the third direction and a second height in a fourth direction. The second height may be different from the first height. Moreover, the semiconductor device may include a second source/drain region electrically connected to the second active pattern.

According to embodiments of the present inventive concepts, a semiconductor device may include a substrate including first and second regions. The semiconductor device may include a first gate structure extending in a first direction, in the first region. The semiconductor device may include a first active pattern intersecting the first gate structure and having a first width in the first direction and a first height in a second direction. The first width may be smaller than the first height. The semiconductor device may include a first source/drain region electrically connected to the first active pattern. The semiconductor device may include a second gate structure extending in a third direction, in the second region. The semiconductor device may include a second active pattern penetrating through the second gate structure and having a second width in the third direction and a second height in a fourth direction. The second width may be smaller than the second height, and the second height may be smaller than the first height. Moreover, the semiconductor device may include a second source/drain region electrically connected to the second active pattern.

According to embodiments of the present inventive concepts, a semiconductor device may include a first gate structure extending in a first direction, in a first region. The semiconductor device may include a first active pattern penetrating through the first gate structure and having a first width in the first direction and a first height in a second direction. The first width may be smaller than the first height. The semiconductor device may include a first source/drain region electrically connected to the first active pattern. The semiconductor device may include a second gate structure extending in a third direction, in a second region. The semiconductor device may include a second active pattern penetrating through the second gate structure and having a second width in the third direction and a second height in a fourth direction. The second width may be smaller than the second height. The semiconductor device may include a second source/drain region electrically connected to the second active pattern. Moreover, the semiconductor device may include a first spacer between the second source/drain region and the second gate structure and may include the same material as the second source/drain region.

According to embodiments of the present inventive concepts, a semiconductor device may include a substrate. The semiconductor device may include first and second active patterns extending in a first direction on the substrate and having a width in a second direction and a height in a third direction. The first and second active patterns may be spaced apart from each other in the third direction by a distance. The semiconductor device may include a gate structure extending in the second direction and intersecting the first and second active patterns. The gate structure may be between the substrate and the first active pattern, between the first active pattern and the second active pattern, and on the second active pattern. The semiconductor device may include a source/drain region electrically connected to the first and second active patterns. Moreover, the semiconductor device may include a source/drain contact electrically connected to the source/drain region and extending in the third direction. The width may be smaller than the height.

However, aspects of the present inventive concepts are not restricted to those set forth above. The above and other aspects of the present inventive concepts will become more apparent to one of ordinary skill in the art to which the present inventive concepts pertain by referencing the detailed description of the example embodiments given below.

BRIEF DESCRIPTION OF THE DRAWINGS

The above and other aspects and features of the inventive concepts will become more apparent by describing in detail example embodiments thereof with reference to the attached drawings.

DETAILED DESCRIPTION

Figure 1:
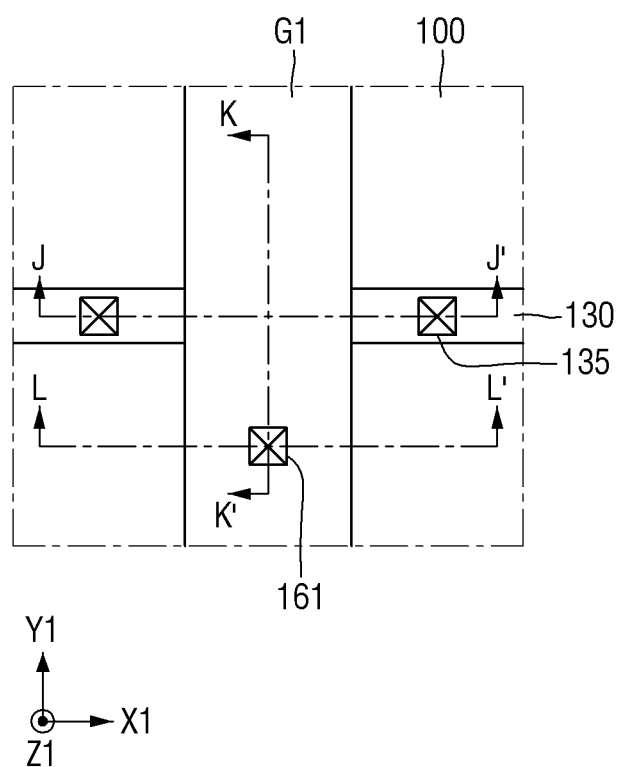
FIG. 1 is a layout diagram of a semiconductor device according to some embodiments.
Figure 2:
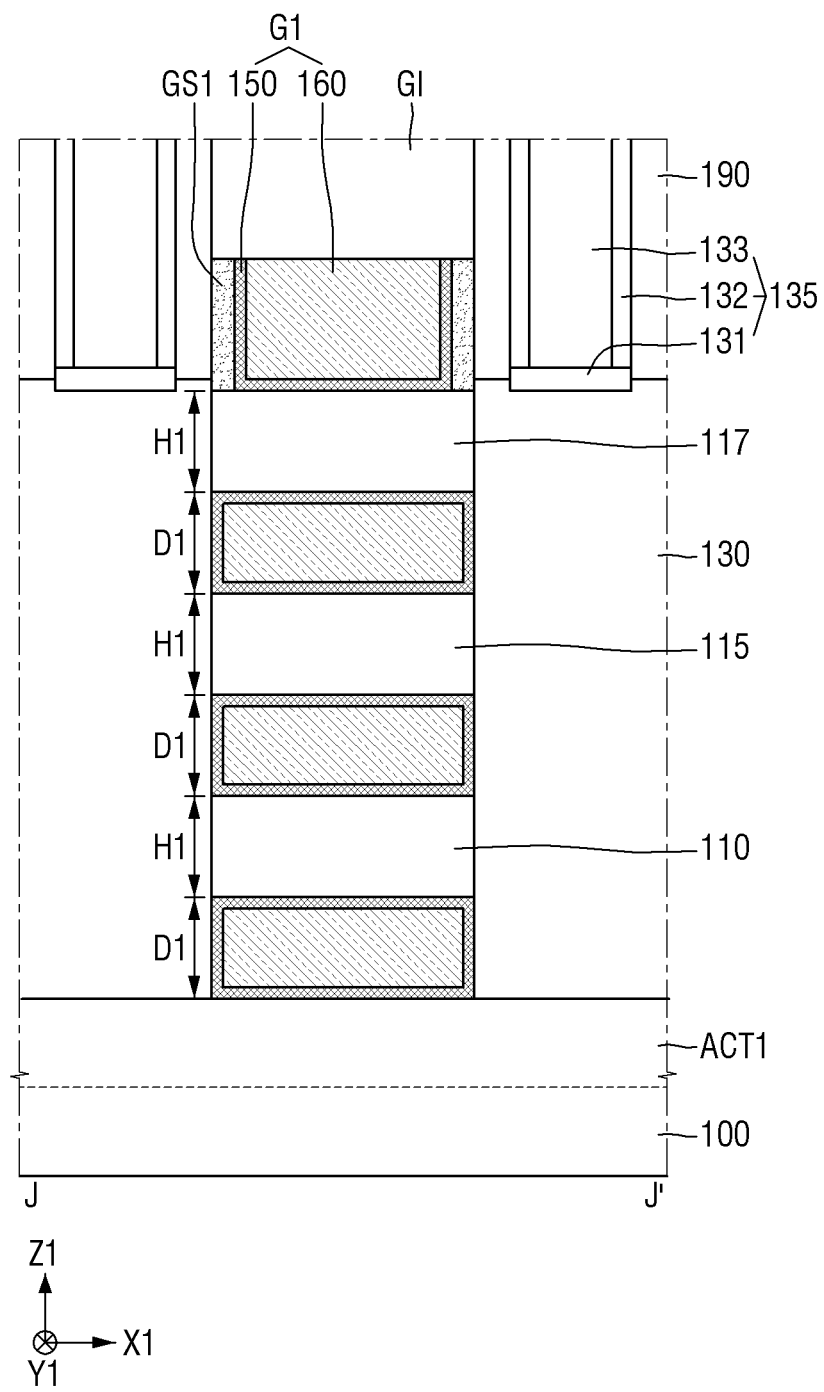
FIGS. 2 to 4 are cross-sectional views taken along lines J-J', K-K' and L-L' of FIG. 1, respectively.
Figure 3:
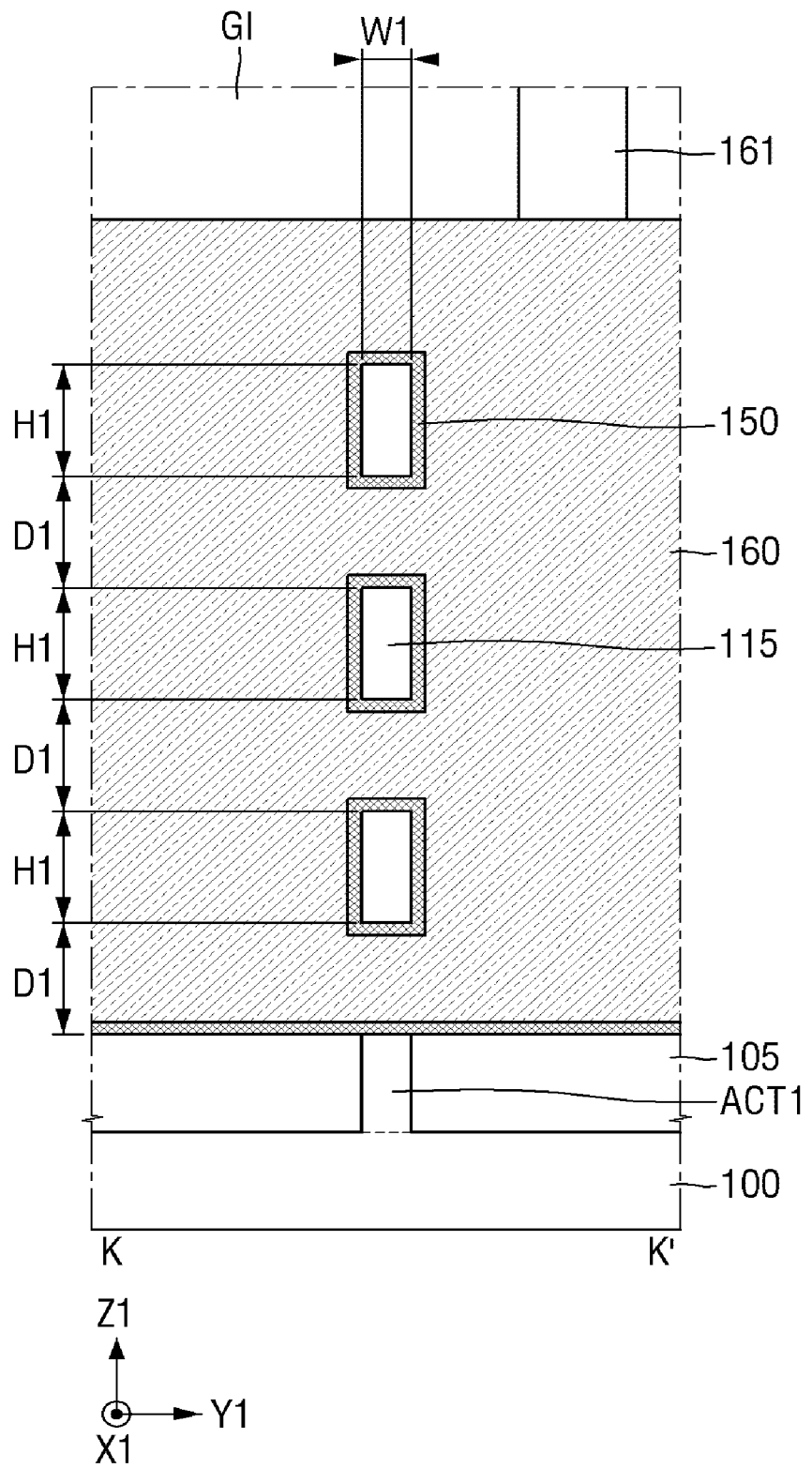
Figure 4:
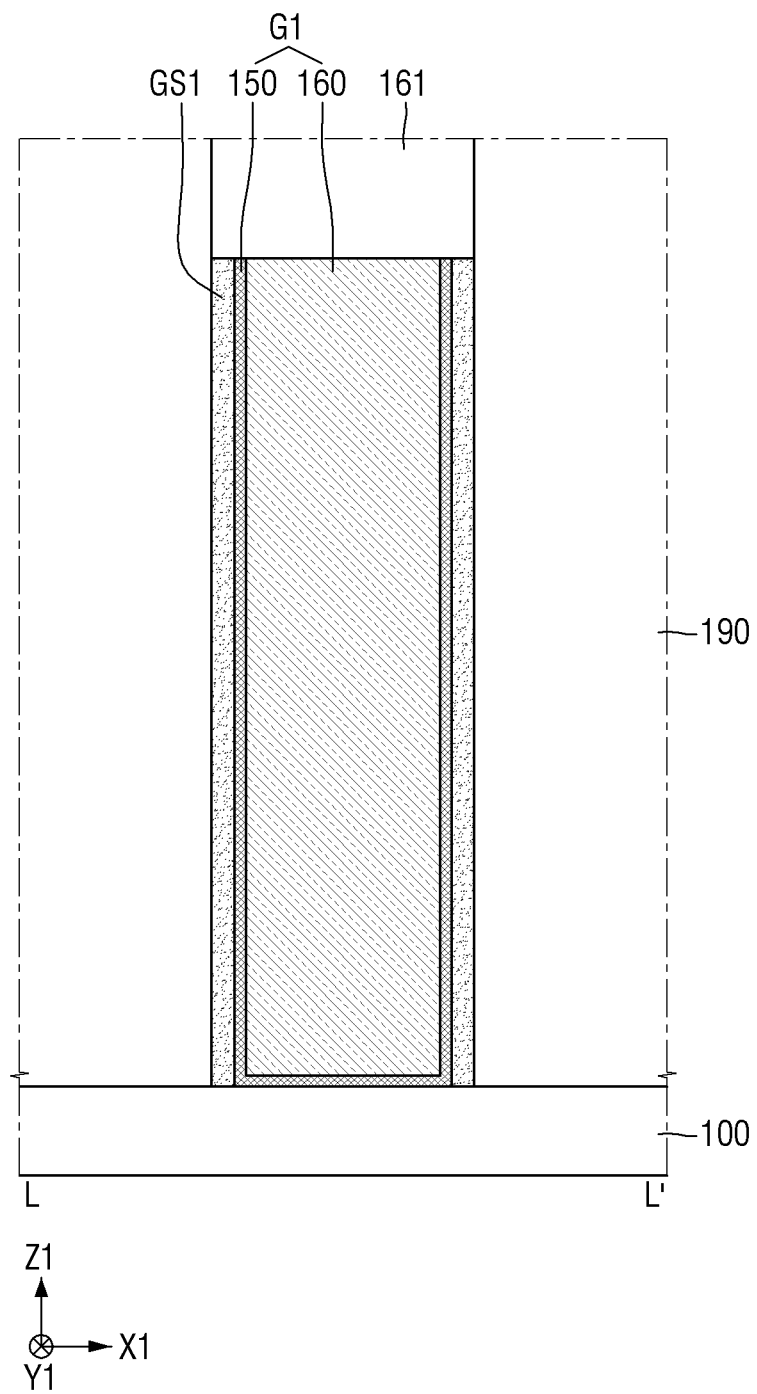

FIG. 1 is a layout diagram of a semiconductor device according to some embodiments. FIGS. 2 to 4 are cross-sectional views taken along lines J-J', K-K' and L-L' of FIG. 1, respectively. The semiconductor device according to some embodiments will be described with reference to FIGS. 1 to 4. For convenience of explanation, in the layout diagram, some constituent elements such as an interlayer insulating film 190 will be omitted.

Referring to FIGS. 1 to 4, the semiconductor device according to some embodiments may include a substrate 100, a field insulating film 105, a first active pattern 110, a second active pattern 115, a third active pattern 117, a first gate structure G1, a first gate spacer GS1, a first gate insulating film GI, a source/drain contact 135, a gate contact 161 and an interlayer insulating film 190.

The substrate 100 may be bulk silicon or silicon-on-insulator (SOI). Alternatively, the substrate 100 may be a silicon substrate, or may include other materials, for example, silicon germanium, silicon germanium on insulator (SGOI), indium antimonide, lead tellurium compound, indium arsenide, indium phosphide, gallium arsenide or gallium antimonide. Or, the substrate 100 may have an epitaxial layer formed on a base substrate.

The substrate 100 may include a first active region ACT1. The first active region ACT1 may be a part of the substrate 100. An upper surface of the substrate 100 may be an upper surface of the first active region ACT1. The first active region ACT1 may be formed by etching a part of the substrate 100, and may include an epitaxial layer that is grown from the substrate 100. The first active region ACT1 may include the same material as or a different material from the substrate 100. For example, the first active region ACT1 may include silicon (Si) or germanium (Ge). For example, the first active region ACT1 may include a group IV-IV compound semiconductor or a group III-V compound semiconductor. The group IV-IV compound semiconductor may be, for example, a binary compound or a ternary compound containing at least two or more of carbon (C), silicon (Si), germanium (Ge), and tin (Sn), or a compound formed by doping these elements with a group IV element. The group III-V compound semiconductor may be, for example, one of a binary compound, a ternary compound or a quaternary compound formed by combining at least one of aluminum (Al), gallium (Ga) and indium (In) with at least one of phosphorus (P), arsenic (As) and antimony (Sb). However, this is merely an example, and the present inventive concepts are not limited thereto. The first active region ACT1 may extend in a first direction X1.

The field insulating film 105 may surround at least a part of the first active region ACT1. For example, the first active region ACT1 may be defined by the field insulating film 105. In FIG. 3, although the field insulating film 105 is illustrated as surrounding the entire sidewalls of the first active region ACT1, the present inventive concepts are not limited thereto. That is to say, FIG. 3 illustrates a case in which the upper surface of the field insulating film 105 and the upper surface of the first active region ACT1 are coplanar, but the present inventive concepts are not limited thereto. The field insulating film 105 may include, for example, at least one of an oxide film, a nitride film, an oxynitride film, and a combination thereof.

The first active pattern 110, the second active pattern 115 and the third active pattern 117 may be formed on the first active region ACT1. The first active pattern 110 to the third active pattern 117 may extend in the first direction X1, respectively. The first active pattern 110 to the third active pattern 117 may be spaced apart from each other in a third direction Z1. For example, the first active pattern 110 is spaced apart on the first active region ACT1 by a first distance D1 in the third direction Z1, the second active pattern 115 is spaced apart on the first active pattern 110 by the first distance D1 in the third direction Z1, and the third active pattern 117 may be spaced apart on the second active pattern 115 by the first distance D1 in the third direction Z1. The first active pattern 110 may have a first width W1 in the second direction Y1, and a first height H1 in the third direction Z1. According to some embodiments, the first width W1 may be smaller than the first height H1. In other words, referring to FIGS. 1 and 3, in the first active pattern 110 and the second active pattern 115, a cross section taken along the line K-K' may have a shape that is long in the third direction Z1 and narrow (relative to the first height H1) in the second direction Y1. According to some embodiments, a ratio of the first height H1 to the first distance D1 may be approximately 1:1, and a ratio of the first height H1 to the first width W1 may approximately be 3:1, but the present inventive concepts are not limited thereto. In FIG. 3, the first active pattern 110 to the third active pattern 117 are illustrated as having a rectangular cross section, but the present inventive concepts are not limited thereto. For example, the cross sections of the first active pattern 110 to the third active pattern 117 may have various shapes such as a circle, an ellipse, and a chamfered rectangle. Further, although FIGS. 2 and 3 are described on the assumption that three active patterns are included on the substrate 100, this is only for the sake of convenience of explanation, and the present inventive concepts are not limited thereto. The first, second, and third directions X1, Y1, and Z1 may intersect (e.g., may be perpendicular to) each other.

The first gate structure G1 may include a first gate insulating film 150 and a first gate electrode 160. The first gate insulating film 150 may extend in the second direction Y1. For example, the first gate insulating film 150 may extend along the upper surface of the third active pattern 117 and the sidewall of the first gate spacer GS1. In addition, the first gate insulating film 150 may extend along the sidewalls of the first active pattern 110 to the third active pattern 117. In particular, the first gate insulating film 150 may extend around four sidewalls of each of the first active pattern 110 to the third active pattern 117. In addition, the first gate insulating film 150 may be formed on the substrate 100 and the first active region ACT1. The first gate structure G1 may be formed to cover the first active pattern 110 to the third active pattern 117. That is to say, the first active pattern 110 to the third active pattern 117 may penetrate through the first gate structure G1, respectively. For example, the first gate structure G1 may be formed between the first active region ACT1 and the first active pattern 110, between the first active pattern 110 and the second active pattern 115, between the second active pattern 115 and the third active pattern 117, and on the third active pattern 117.

The first gate insulating film 150 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate, but the present inventive concepts are not limited thereto.

The first gate electrode 160 may extend in the second direction Y1 on the first gate insulating film 150. For example, the first gate electrode 160 may extend in the second direction Y1 between the first active region ACT1 and the first active pattern 110, between the first active pattern 110 and the second active pattern 115, between the second active pattern 115 and the third active pattern 117, and on the third active pattern 117. The first gate electrode 160 may include a conductive material. Some drawings illustrate that the first gate electrode 160 is a single film, but this is only for convenience of explanation, and the present inventive concepts are not limited thereto. For example, the first gate electrode 160 may be a multi-film electrode. For example, the first gate electrode 160 may include a work function conductive film for adjusting a work function, and a filling conductive film for filling a space formed by the work function conductive film. The first gate electrode 160 may include, for example, at least one of TiN, WN, TaN, Ru, TiC, TaC, Ti, Ag, Al, TiAl, TiAlN, TiAlC, TaCN, TaSiN, Mn, Zr, W, and combinations thereof. Alternatively, the first gate electrode 160 may include silicon (Si), silicon germanium (SiGe), or the like instead of metal. Such a first gate electrode 160 may be formed, for example, through a replacement gate process (or a gate last process), but the present inventive concepts are not limited thereto.

The first gate spacers GS1 are spaced apart from each other in the first direction X1 and may be formed on at least a portion of a sidewall of the first gate structure G1. The first gate spacer GS1 may include, for example, at least one of silicon nitride (SiN), silicon oxynitride (SiON), silicon oxide ($SiO_2$), silicon oxycarbonitride (SiOCN), silicon carbonitride (SiCN) or combinations thereof, but the present inventive concepts are not limited thereto. In some drawings, the first gate spacer GS1 is illustrated as a single film structure, but the present inventive concepts are not limited thereto, and the first gate spacer GS1 may have a multi-film structure.

Although not illustrated in the drawing, an interfacial layer may be formed between the first gate insulating film 150 and the first active pattern 110 to the third active pattern 117, and between the first gate insulating film 150 and the first active region ACT1. The interfacial layer may be formed along the profile of the first gate insulating film 150, but the present inventive concepts are not limited thereto.

The first source/drain region 130 may be formed on at least one sidewall of the first gate structure G1. In addition, the first source/drain region 130 may be formed on at least one sidewall of the first active pattern 110 to the third active pattern 117. In addition, the first source/drain region 130 may be on (and electrically connected to) the first active pattern 110 to the third active pattern 117. For example, the first source/drain region 130 may be in contact with the first active pattern 110 to the third active pattern 117. The first source/drain region 130 may include an epitaxial layer formed in the first active region ACT1. In addition, the first source/drain region 130 may be an elevated source and drain region including an upper surface protruding upward from the upper surface of the third active pattern 117. However, the present inventive concepts are not limited thereto, and the first source/drain region 130 may be an impurity region formed in the substrate 100. The first source/drain region 130 may be formed, using a SEG (Selective Epitaxial Growth) process, but the present inventive concepts are not limited thereto.

For example, when the substrate 100 is a PMOS region, the first source/drain region 130 may include p-type impurities or impurities for preventing/inhibiting diffusion of the p-type impurities. For example, the first source/drain region 130 may include at least one of boron (B), carbon (C), indium (In), gallium (Ga), aluminum (Al), and combinations thereof. In addition, when the first region I of the substrate 100 is a PMOS region, the first source/drain region 130 may include a compressive stress material. For example, when the first active pattern 110 to the third active pattern 117 are silicon (Si), the first source/drain region 130 may include a material having a lattice constant greater than that of silicon (Si). For example, the first source/drain region 130 may include silicon germanium (SiGe).

In contrast, when the substrate 100 is an NMOS region, the first source/drain region 130 may include n-type impurities or impurities for preventing/inhibiting diffusion of the n-type impurities. For example, the first source/drain region 130 may include at least one of phosphorus (P), antimony (Sb), arsenic (As), and combinations thereof. Also, when the substrate 100 is an NMOS region, the first source/drain region 130 may include a tensile stress material. For example, when the first active pattern 110 to the third active pattern 117 are silicon (Si), the first source/drain region 130 may include a material having a lattice constant smaller than that of silicon (Si), and may include, for example, silicon carbide (SiC). However, in some embodiments, the first source/drain region 130 may not include a tensile stress material.

The source/drain contact 135 may be electrically connected to the first source/drain region 130. The source/drain contact 135 may include a contact layer 131, a metal barrier 132 and a metal material 133. The contact layer 131 may be in contact with the first source/drain region 130. The contact layer 131 may include both the material contained in the metal barrier 132 and the material contained in the first source/drain region 130. The metal barrier 132 may prevent/inhibit leakage of the metal material 133. The metal barrier 132 may include, for example, Ti or TiN, but the present inventive concepts are not limited thereto. The metal material 133 may fill a region defined by the contact layer 131 and the metal barrier 132.

The first gate insulating film GI may prevent/inhibit the first gate structure G1 from coming into contact with structures other than the gate contact 161. In some embodiments, the first gate insulating film (e.g., dielectric) GI may not include oxide. However, the present inventive concepts are not limited thereto. The gate contact 161 may be formed on the first gate structure G1. The first gate contact 161 may be in contact with the first gate structure G1.

The interlayer insulating film 190 may be formed on the substrate 100. In addition, the interlayer insulating film 190 may surround outer walls of the first gate spacer GS1. The interlayer insulating film 190 may also be formed between the source/drain contact 135 and the first gate structure G1, and between the source/drain contact 135 and the first gate insulating film GI, but the present inventive concepts are not limited thereto. For example, unlike the configuration illustrated in FIG. 2, the metal barrier 132 may be in contact with the first gate spacer GS1 and the first gate insulating film GI. The interlayer insulating film 190 may include, for example, at least one of silicon oxide, silicon nitride, silicon oxynitride and a low dielectric constant material. The low dielectric constant material may include, but is not limited to, for example, FOX, TOSZ, USG, BSG, PSG, BPSG, PETEOS, FSG, CDO, Xerogel, Aerogel, Amorphous Fluorinated Carbon, OSG, Parylene, BCB, SiLK, polyimide, porous polymeric material, and combinations thereof.

Figure 5:
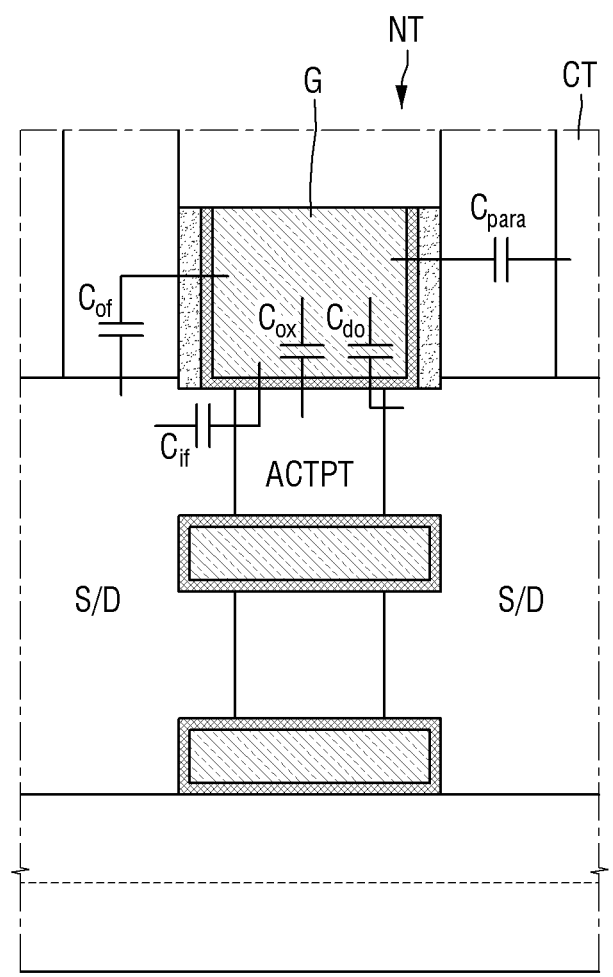
FIG. 5 is an example diagram for explaining a capacitance generated in the structure of a nanosheet transistor.
Figure 6:
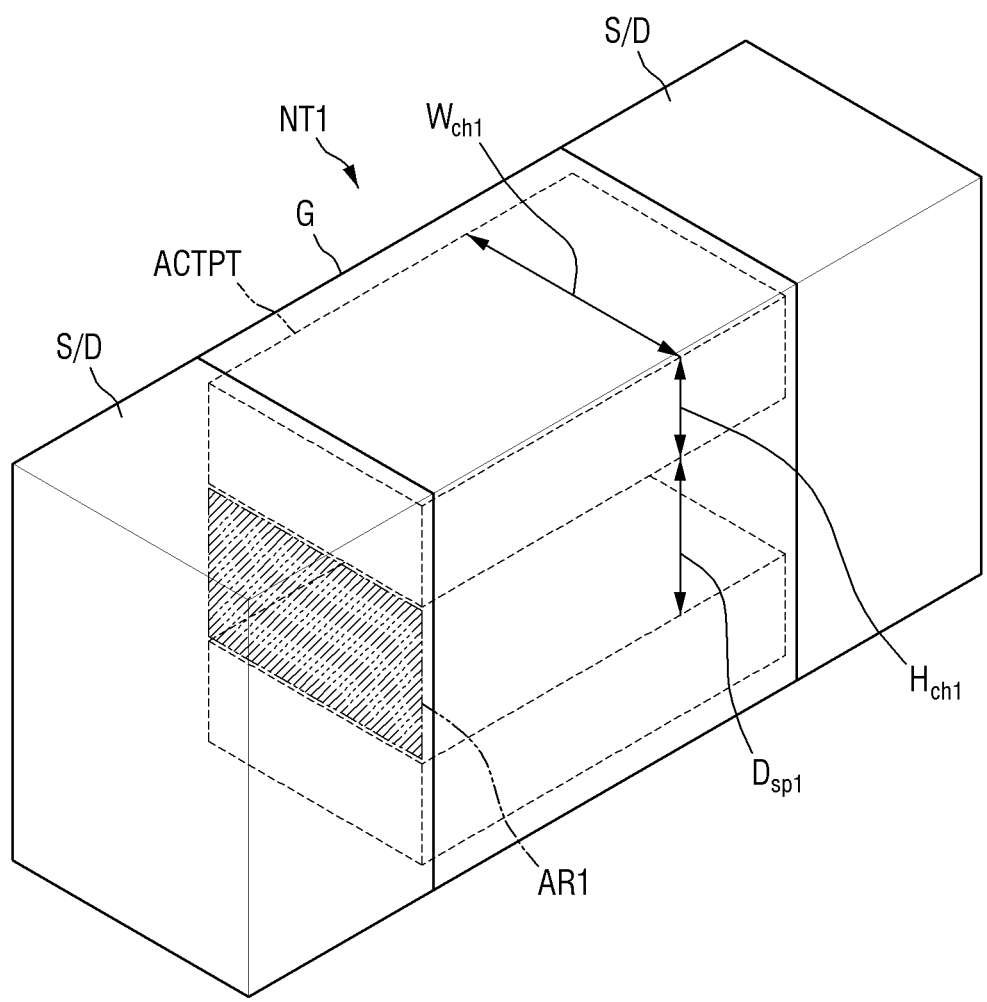
FIGS. 6 and 7 are example views for explaining a relationship between a width of the active pattern and an effective capacitance in the structure of a nanosheet transistor.
Figure 7:
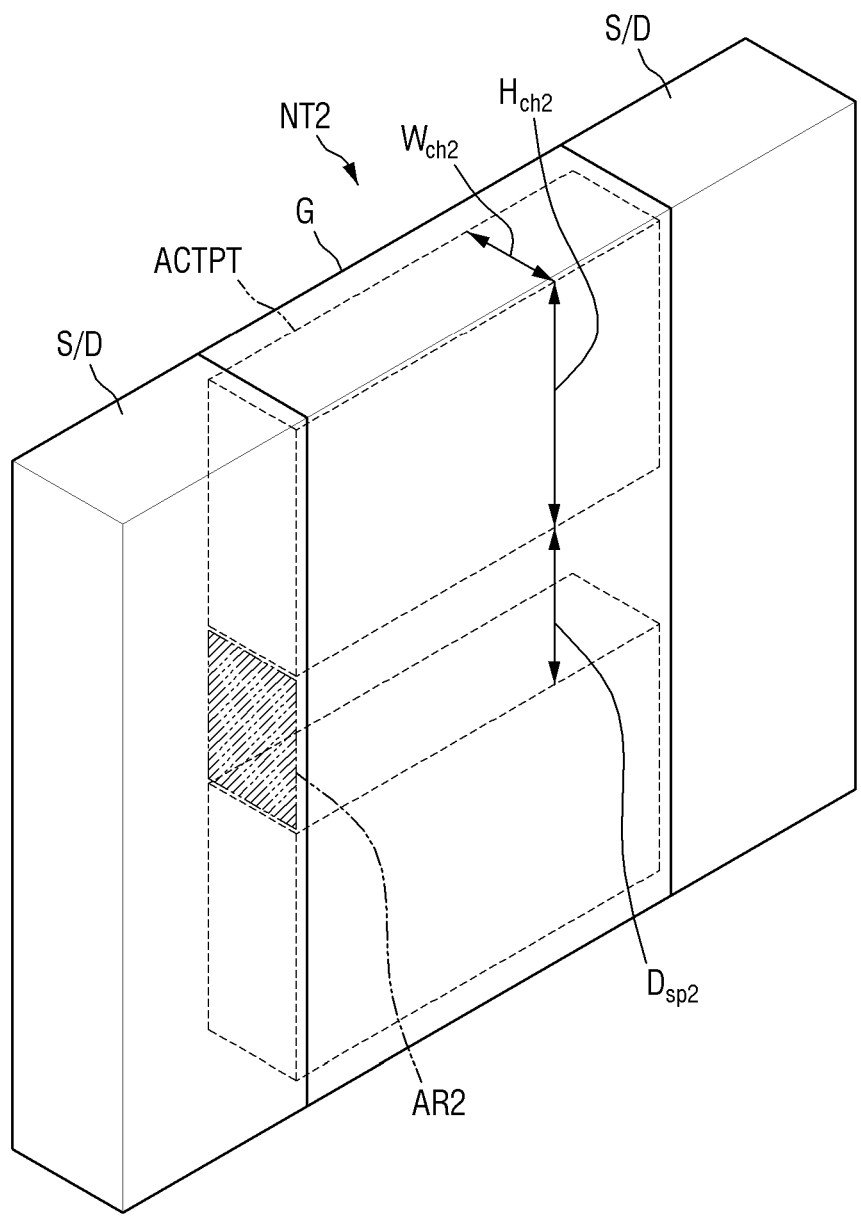
Figure 8:
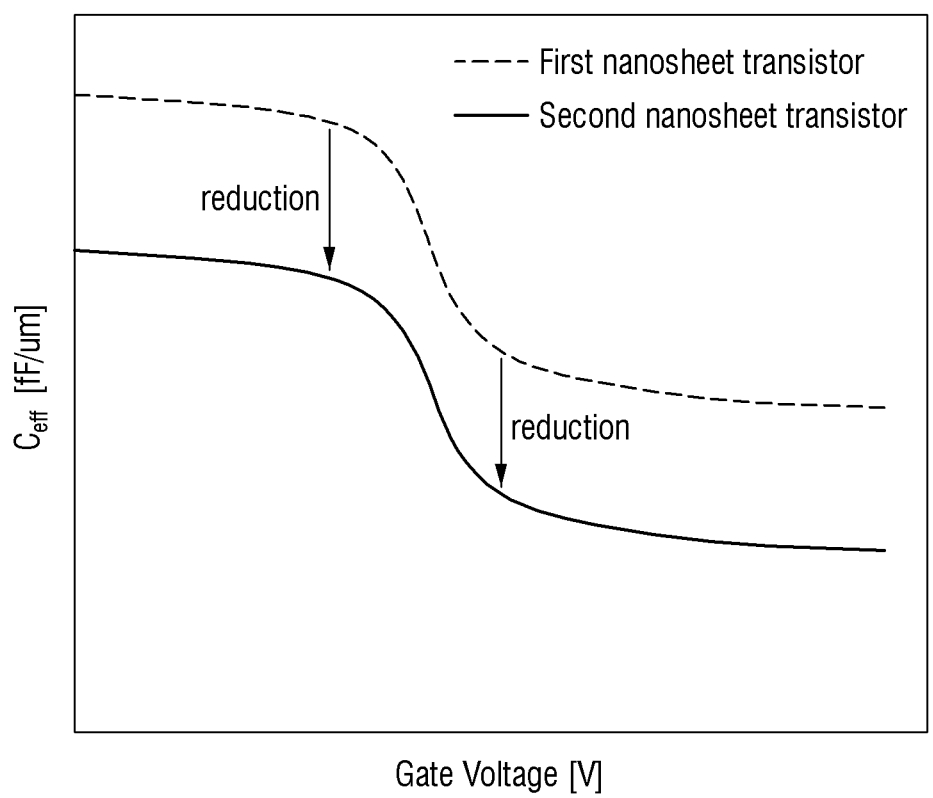
FIGS. 8 and 9 are graphs illustrating the performance of the nanosheet transistor according to FIGS. 6 and 7.
Figure 9:
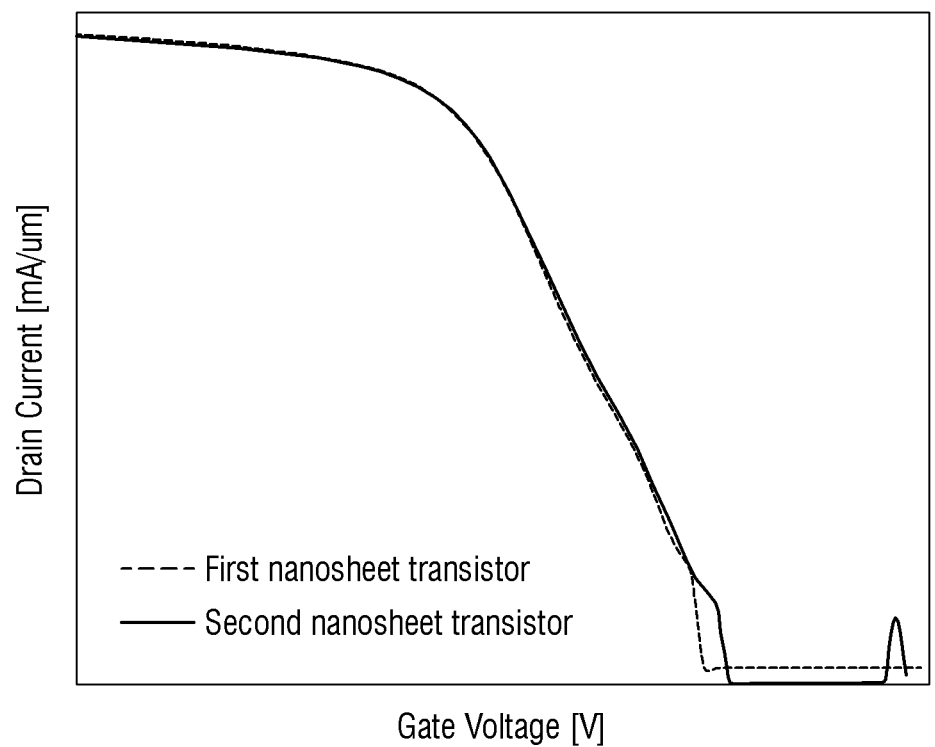

FIG. 5 is an example diagram for explaining a capacitance generated in the structure of a nanosheet transistor. FIGS. 6 and 7 are example views for explaining a relationship between a width of the active pattern and an effective capacitance in the structure of a nanosheet transistor. FIGS. 8 and 9 are graphs illustrating the performance of the nanosheet transistor according to FIGS. 6 and 7.

Referring to FIG. 5, various capacitances may be caused in the nanosheet transistor NT. First, a parasitic capacitance having the gate dielectric film, the gate spacer and the interlayer insulating film as a dielectric, that is, a first capacitance $C_{para}$ may be generated between the gate G and the contact CT of the source/drain S/D. Also, a second capacitance $C_{ox}$ having a gate insulating film as a dielectric may be generated between the gate G and the active pattern ACTPT. Further, in a region in which the gate G and the source/drain S/D overlap, a third capacitance $C_{do}$ having the gate insulating film as a dielectric may be generated. Further, a fourth capacitance $C_{if}$ having the gate insulating film and the active pattern ACTPT as a dielectric may be generated between the gate G and the source/drain S/D. Also, a fifth capacitance $C_{of}$ having an interlayer insulating film as a dielectric may be generated between the gate G and the source/drain S/D. At this time, since the first capacitance $C_{para}$ to the fifth capacitance $C_{of}$ are all connected in parallel, the effective capacitance $C_{eff}$ of the nanosheet transistor NT may be calculated by the following formula 1 and a delay time ti of the nanosheet transistor NT may be calculated by the following formula 2.

$$C_{eff}=C_{ox}+C_{do}+C_{if}+C_{of}+C_{para} \quad \text{[Formula 1]}$$

$$\tau=R_{eff}C_{eff}\text{(Reff is an effective resistance of the nanosheet transistor NT)} \quad \text{[Formula 2]}$$

At this time, the capacitance which has the greatest influence on the effective capacitance $C_{eff}$ of the nanosheet transistor NT is the fifth capacitance $C_{of}$, and the fifth capacitance $C_{of}$ is proportional to an area in which the gate G and the source/drain S/D are in contact with each other. Therefore, as the area of contact between the gate G and the source/drain S/D is small, the fifth capacitance $C_{of}$ becomes smaller and the effective capacitance $C_{eff}$ of the nanosheet transistor NT also becomes smaller accordingly. Finally, as the area of contact between the gate G and the source/drain S/D is small, the delay time τ of the nanosheet transistor NT becomes shorter, and the performance may be improved. For illustrative explanation, reference is made to FIGS. 6 and 7.

First, referring to FIG. 6, the active pattern ACTPT of the first nanosheet transistor NT1 may have a first active pattern width $W_{ch1}$ and a first active pattern height $H_{ch1}$. The first active pattern width $W_{ch1}$ may be greater than the first active pattern height $H_{ch1}$. Also, the active pattern ACTPT may be spaced apart from the adjacent active pattern by a first interval $D_{sp1}$. At this time, the first area AR1 in which the gate G and the source/drain S/D are in contact with each other may be the first active pattern width $W_{ch1}$× the first interval $D_{sp1}$.

Referring to FIG. 7, the active pattern ACTPT of the second nanosheet transistor NT2 may have a second active pattern width $W_{ch2}$ and a second active pattern height $H_{ch2}$. The second active pattern width $W_{ch2}$ may be smaller than the second active pattern height $H_{ch2}$. Also, the active pattern ACTPT may be spaced apart from the adjacent active pattern by a second interval $D_{sp2}$. At this time, the second area AR2 in which the gate G and the source/drain S/D are in contact with each other may be the second active pattern width $W_{ch2}$× the second interval $D_{sp2}$.

In FIGS. 6 and 7, it is assumed that the first active pattern width $W_{ch1}$ and the second active pattern height $H_{ch2}$ are identical to each other, and the first active pattern height $H_{ch1}$ and the second active pattern width $W_{ch2}$ are identical to each other, and the first interval $D_{sp1}$ and the second interval $D_{sp2}$ are identical to each other. In such a case, since the first active pattern width $W_{ch1}$ is greater than the second active pattern width $W_{ch2}$, the first area AR1 is greater than the second area AR2. Therefore, the effective capacitance $C_{eff}$ of the first nanosheet transistor NT1 is greater than the effective capacitance $C_{eff}$ of the second nanosheet transistor NT2. On the other hand, in FIGS. 6 and 7, the product of the first active pattern width $W_{ch1}$ and the first active pattern height $H_{ch1}$ is identical to the product of the second active pattern width $W_{ch2}$ and the second active pattern height $H_{ch2}$. That is to say, the effective channel widths of each of the first nanosheet transistor NT1 and the second nanosheet transistor NT2 may be identical to each other.

That is, the effective capacitance $C_{eff}$ of the first nanosheet transistor NT1 is greater than the effective capacitance $C_{eff}$ of the second nanosheet transistor NT2, and the effective channel widths of the first nanosheet transistor NT1 and the second nanosheet transistor NT2 are identical to each other. Therefore, as illustrated in FIG. 8, when the structure of the first nanosheet transistor NT1 is changed to the structure of the second nanosheet transistor NT2, the effective capacitance $C_{eff}$ may be reduced. Further, as illustrated in FIG. 9, since the effective channel widths of the first nanosheet transistor NT1 and the second nanosheet transistor NT2 are identical to each other, I-V curve characteristics of each of the first nanosheet transistor NT1 and the second nanosheet transistor NT2 may be similar to each other.

That is, when the structure of the first nanosheet transistor NT1 is changed to the structure of the second nanosheet transistor NT2 due to the difference in effective capacitance $C_{eff}$, since the delay time τ is short, the performance is improved, and the I-V curve characteristics may be maintained. Further, since the first active pattern width $W_{ch1}$ is greater than the second active pattern width $W_{ch2}$, the second nanosheet transistor NT2 has a smaller area on the layout than the first nanosheet transistor NT1, and the degree of integration of the semiconductor device may be improved. Furthermore, as the second nanosheet transistor NT2 has a relatively small second active pattern width $W_{ch2}$, the burden of removing a sacrificial layer formed between the active patterns ACTPT at the time of the fabricating process is reduced, and the burden of forming the gate dielectric and the gate electrode in the space in which the sacrificial layer is removed may also be reduced.

Figure 10:
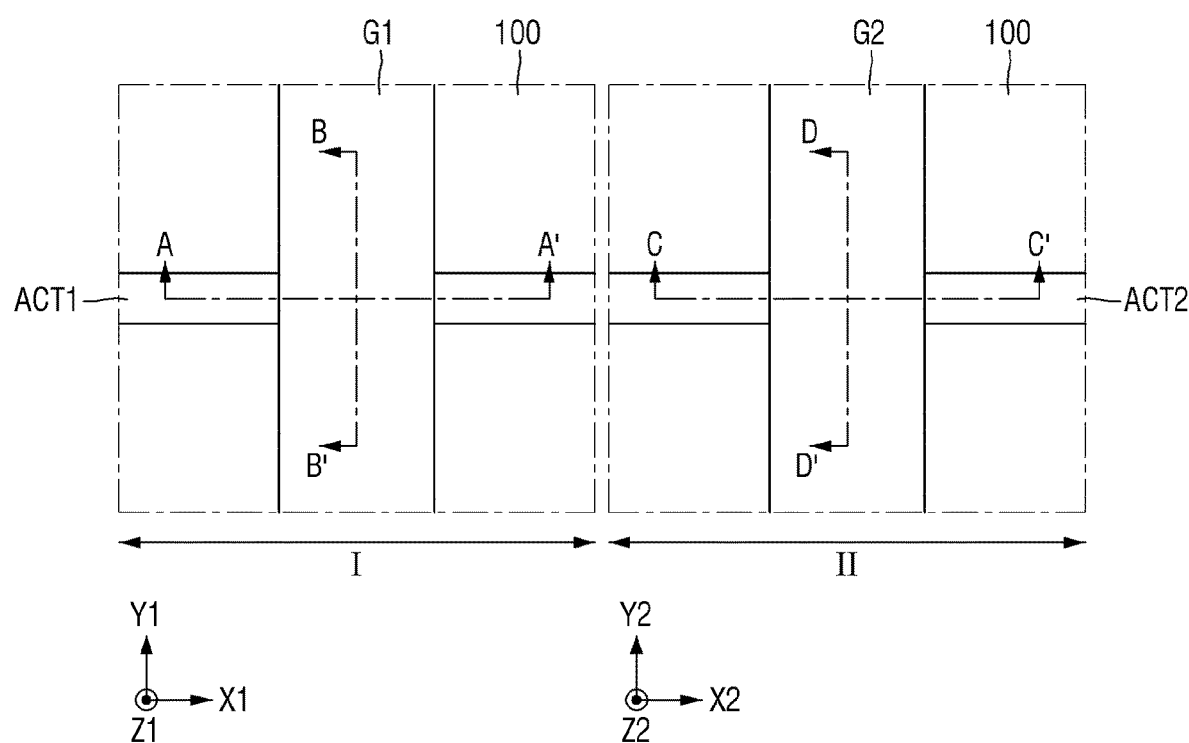
FIG. 10 is an example layout for explaining a semiconductor device according to some embodiments.

FIG. 10 is an example layout for explaining a semiconductor device according to some embodiments. FIGS. 11 to 17 are example cross-sectional views for explaining the semiconductor device of FIG. 10 according to some embodiments. Hereinafter, the source/drain contact 135 and the gate contact 161 are omitted for convenience of explanation. Further, hereinafter, for convenience of explanation, it is illustrated that the structure of each nanosheet transistor includes two active patterns. However, the present inventive concepts are not limited thereto, and a person having ordinary knowledge in the technical field of the present inventive concepts may appropriately adjust the source/drain contact 135 and the gate contact 161 in an appropriate manner without undue experimentation, and may implement several embodiments of the present inventive concepts by stacking one or more than three active patterns as needed. Further, for the sake of convenience of explanation, repeated or similar contents of the above-described contents may be omitted or briefly described.

Figure 11:
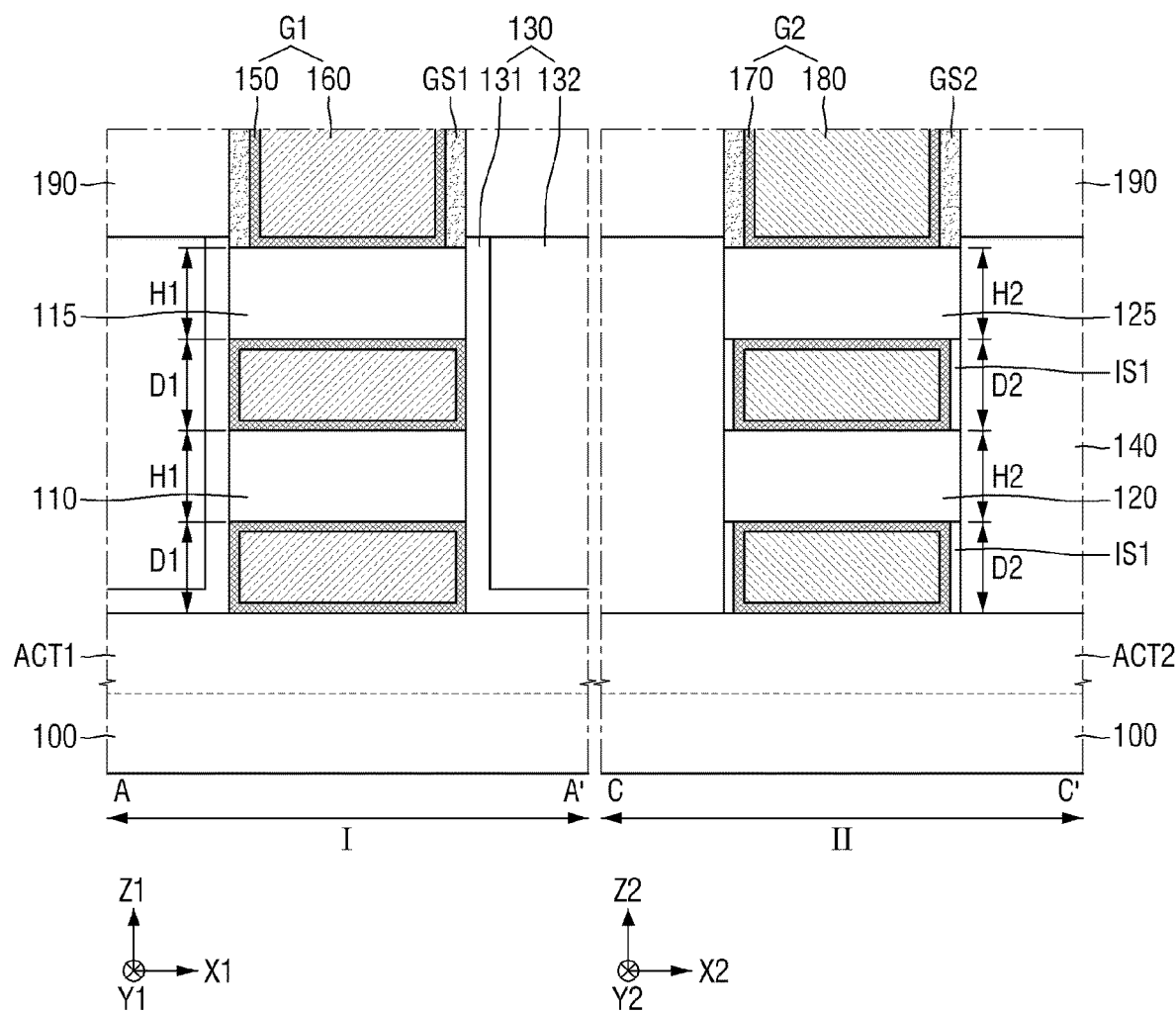
FIGS. 11 to 17 are example cross-sectional views for explaining the semiconductor device of FIG. 10 according to some embodiments.

Referring to FIGS. 10 and 11, the semiconductor device according to some embodiments includes a substrate 100, a field insulating film 105, a first active pattern 110, a second active pattern 115, a fourth active pattern 120, a fifth active pattern 125, a first gate structure G1, a first gate spacer GS1, a second gate structure G2, a second gate spacer GS2, a first source/drain region 130, a second source/drain region 140 and an interlayer insulating film 190.

The substrate 100 may include a first region I and a second region II. The first region I and the second region II of the substrate 100 may be regions adjacent to each other, and may be regions that are spaced apart from each other. Different types of transistors may be formed in the first region I and the second region II of the substrate 100. For example, when a PMOS transistor is formed in the first region I of the substrate 100, an NMOS transistor may be formed in the second region II of the substrate 100. In another example, when an NMOS transistor is formed in the first region I of the substrate 100, a PMOS transistor may be formed in the second region II of the substrate 100. However, the present inventive concepts are not limited thereto, and the same type of transistors may be formed in the first region I and the second region II of the substrate 100. For example, the NMOS transistors or the PMOS transistors may be formed both in the first region I and the second region II of the substrate 100.

The first active region ACT1 may extend in the first direction X1 in the first region I of the substrate 100, and the second active region ACT2 may extend in the fourth direction X2 in the second region II of the substrate 100. The fourth active pattern 120 and the fifth active pattern 125 are spaced apart from each other by a second distance D2 on the second active region ACT2 and may extend in the fourth direction X2. Since the second active region ACT2 is similar to the first active region ACT1, and the fourth active pattern 120 and the fifth active pattern 125 are similar to the first active pattern 110 and the second active pattern 115, a specific description thereof will not be provided. Further, since the second gate structure G2, the second gate spacer GS2, and the second source/drain region 140 are similar to the first gate structure G1, the first gate spacer GS1 and the first source/drain region 130, respectively, a specific description thereof will not be provided. For example, the second gate structure G2 may include a second gate insulating film 170 and a second gate electrode 180 that are similar to the first gate insulating film 150 and the first gate electrode 160, respectively.

The first width W1 of the first active pattern 110 and the second active pattern 115 in the second direction Y1 may be smaller than the first height H1 in the third direction Z1. Similarly, the second width W2 of the fourth active pattern 120 and the fifth active pattern 125 in the fifth direction Y2 may be smaller than the second height H2 in the sixth direction Z2. In some embodiments, the third direction Z1 and the sixth direction Z2 may be identical to each other. The fourth, fifth, and sixth directions X2, Y2, and Z2 may intersect (e.g., may be perpendicular to) each other.

Moreover, in some embodiments, a sidewall of the first gate structure G1 that faces the first source/drain region 130 may be longer in the third direction Z1 than in the second direction Y1. Accordingly, the first gate structure G1 may have a relatively narrow (and thus small) area of contact with the first source/drain region 130 (or with a first spacer IS1 therebetween), which may reduce an effective capacitance in a transistor. Similarly, a sidewall of the second gate structure G2 that faces the second source/drain region 140 may be longer in the sixth direction Z2 than in the fifth direction Y2.

According to some embodiments, the first source/drain region 130 may be a multi-film source/drain region. For example, the first source/drain region 130 may include a first epitaxial layer 131 and a second epitaxial layer 132. The first epitaxial layer 131 may be formed on the upper surface of the substrate 100, and the sidewalls of the first active pattern 110, the second active pattern 115 and the first gate structure G1. The second epitaxial layer 132 may be formed on the first epitaxial layer 131. The first epitaxial layer 131 and the second epitaxial layer 132 may include the same material as each other. For example, the first epitaxial layer 131 and the second epitaxial layer 132 may include a first material. However, the first epitaxial layer 131 may include the first material of a first concentration, and the second epitaxial layer 132 may include the first material of a second concentration. At this time, the first concentration may be smaller than the second concentration. For example, when the first epitaxial layer 131 includes silicon germanium (SiGe) of the first concentration, the second epitaxial layer 132 may include silicon germanium (SiGe) of the second concentration of higher than the first concentration. In another example, when the first epitaxial layer 131 includes germanium (Ge) of the first concentration, the second epitaxial layer 132 may include germanium (Ge) of the second concentration higher than the first concentration. The first epitaxial layer 131 may function as a buffer layer which prevents/protects the first source/drain region 130 from being etched when etching the sacrificial layer in the process of fabricating the semiconductor device according to some embodiments. Also, the first epitaxial layer 131 may minimize/reduce a lattice mismatch or a lattice dislocation with the first active pattern 110 and the second active pattern 115 in the process of forming the first source/drain region 130. In addition, the first epitaxial layer 131 may function as a seed layer of the second epitaxial layer 132 in the process of forming the first source/drain region 130.

The first spacer IS1 may be formed between the second source/drain region 140 and the second gate structure G2 in the second region II of the substrate 100. In addition, the first spacer IS1 may be formed between the second active region ACT2 and the fourth active pattern 120, and between the fourth active pattern 120 and the fifth active pattern 125. According to some embodiments, the first spacer IS1 may include the same second material as the second source/drain region 140. For example, when the second source/drain region 140 includes silicon (Si), the first spacer IS1 may include silicon (Si). In another example, when the second source/drain region 140 includes silicon carbide (SiC), the first spacer IS1 may include silicon carbide (SiC). Since the first spacer IS1 includes the same material as the second source/drain region 140, when forming the second source/drain region 140, the lattice mismatch between the first spacer IS1 and the source/drain regions 140 may be minimized/reduced. Also, when forming the second source/drain region 140, the first spacer IS1 may function as a seed layer of the second source/drain region 140.

According to some embodiments, the first distance D1 between the first active pattern 110 and the second active pattern 115 may be substantially the same as (i.e., equal to) the second distance D2 between the fourth active pattern 120 and the fifth active pattern 125. The term "substantially same" is meant to allow fabricating errors or measurement errors. For example, when forming a semiconductor layer having a fabricating thickness error of 1 nanometer (nm), a semiconductor layer having a thickness of 100 nm and a semiconductor layer having a thickness of 101 nm have substantially the same thickness.

Figure 12:
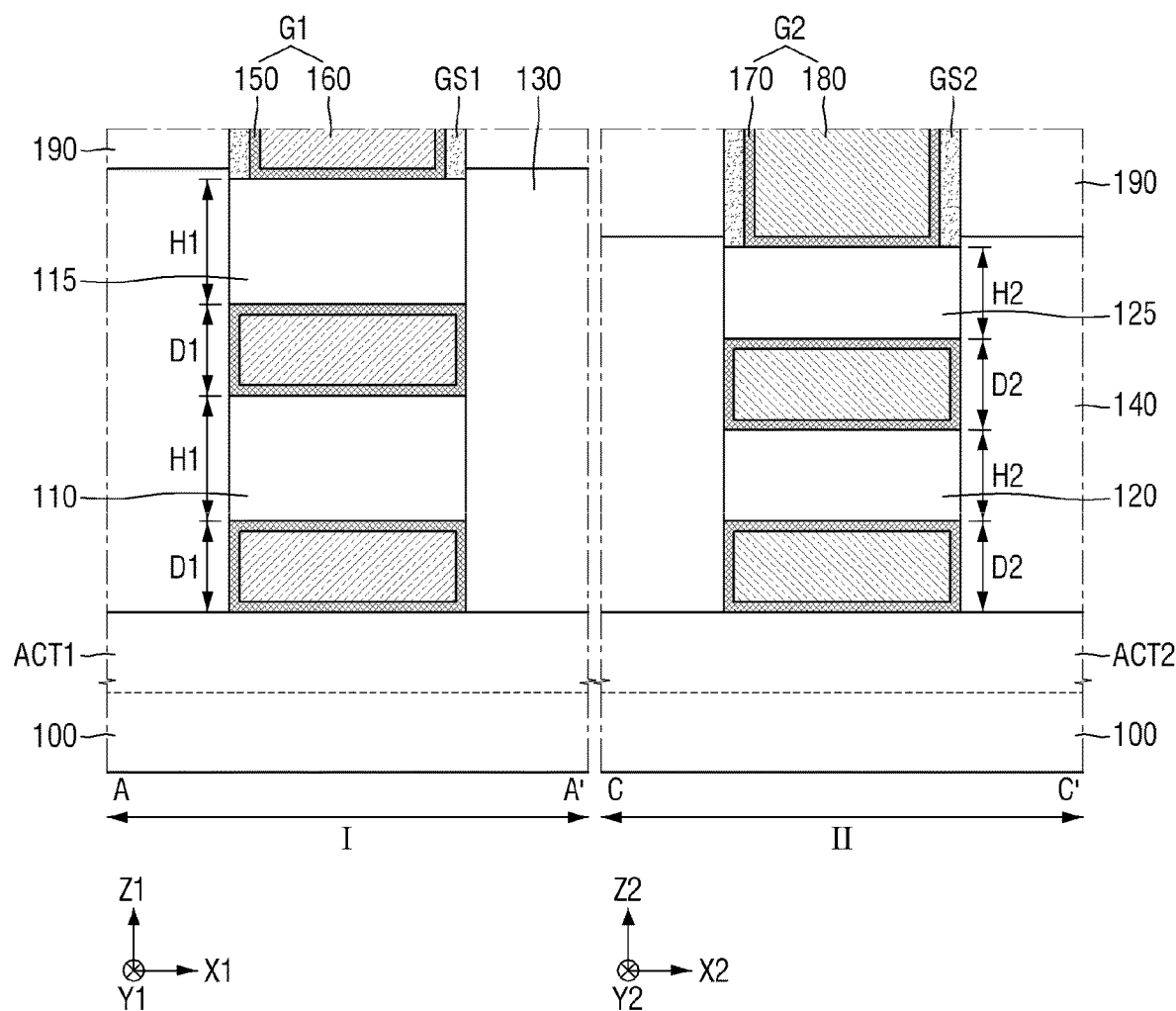
Figure 13:
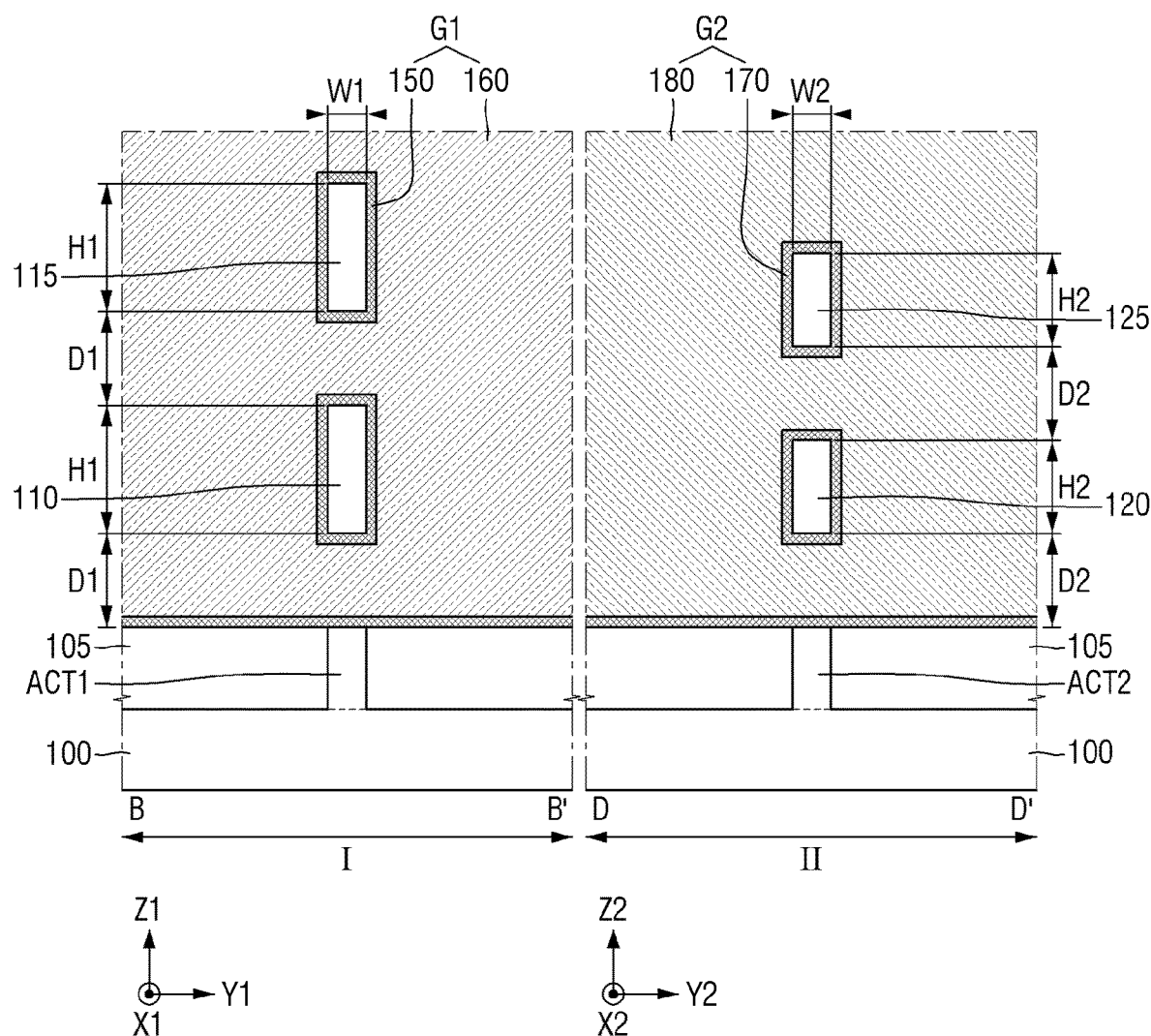

The semiconductor device according to some embodiments will be described with reference to FIGS. 10, 12, and 13. The first width W1 in the second direction Y1 of the first active pattern 110 and the second active pattern 115 may be smaller than the first height H1 in the third direction Z1. Similarly, the second width W2 in the fifth direction Y2 of the fourth active pattern 120 and the fifth active pattern 125 may be smaller than the second height H2 in the sixth direction Z2.

According to some embodiments, the first height H1 in the third direction Z1 of the first active pattern 110 and the second active pattern 115 may be greater than the second height H2 in the sixth direction Z2 of the fourth active pattern 120 and the fifth active pattern 125. As the first height H1 of the first active pattern 110 and the second active pattern 115 increases, since the effective channel width of the transistor increases, the driving current of the transistor increases. For example, the first active pattern 110 and the second active pattern 115 are formed in a region requiring the relatively large driving current, and the fourth active pattern 120 and the fifth active pattern 125 may be formed in a region requiring the relatively small driving current. As another example, the first active pattern 110 and the second active pattern 115 are formed in the PMOS region in which the carrier mobility is relatively small, and the fourth active pattern 120 and the fifth active pattern 125 are formed in the NMOS region in which the carrier mobility is relatively high, thereby making it possible to balance the driving currents between the PMOS transistor and the NMOS transistor.

Figure 14:
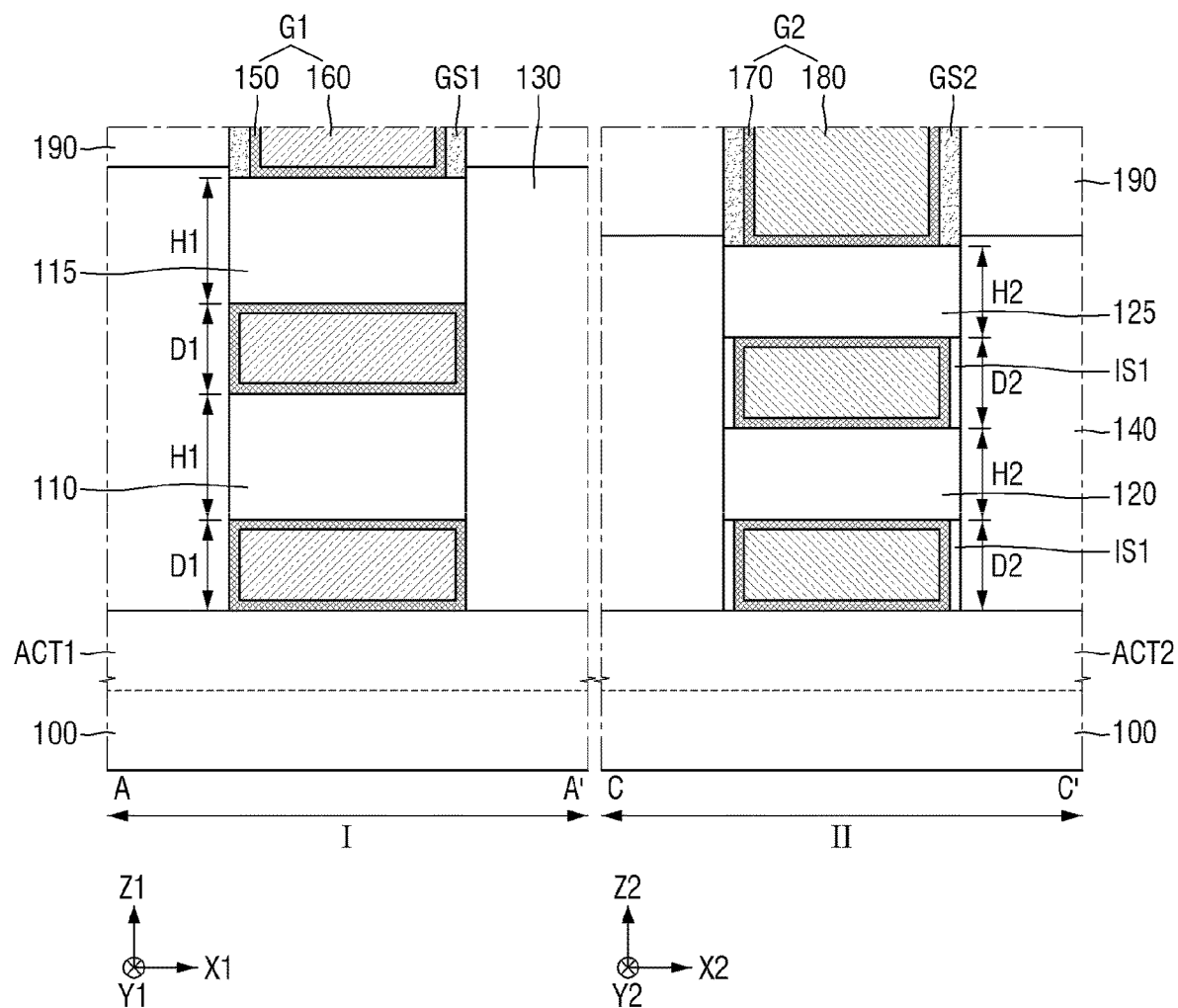

The semiconductor device according to some embodiments will be described with reference to FIGS. 10, 13, and 14. The semiconductor device according to some embodiments may further include a first spacer IS1 in the semiconductor device described with reference to FIGS. 10, 12, and 13.

As described above, the first spacer IS1 may be formed between the second source/drain region 140 and the second gate structure G2 in the second region II of the substrate 100. Further, the first spacer IS1 may be formed between the second active region ACT2 and the fourth active pattern 120, and between the fourth active pattern 120 and the fifth active pattern 125. According to some embodiments, the first spacer IS1 may include the same second material as the second source/drain region 140. Since the first spacer IS1 includes the same material as the second source/drain region 140, when forming the second source/drain region 140, the lattice mismatch between the first spacer IS1 and the second source/drain region 140 may be minimized/reduced. Also, when forming the second source/drain region 140, the first spacer IS1 may function as a seed layer of the second source/drain region 140.

Figure 15:
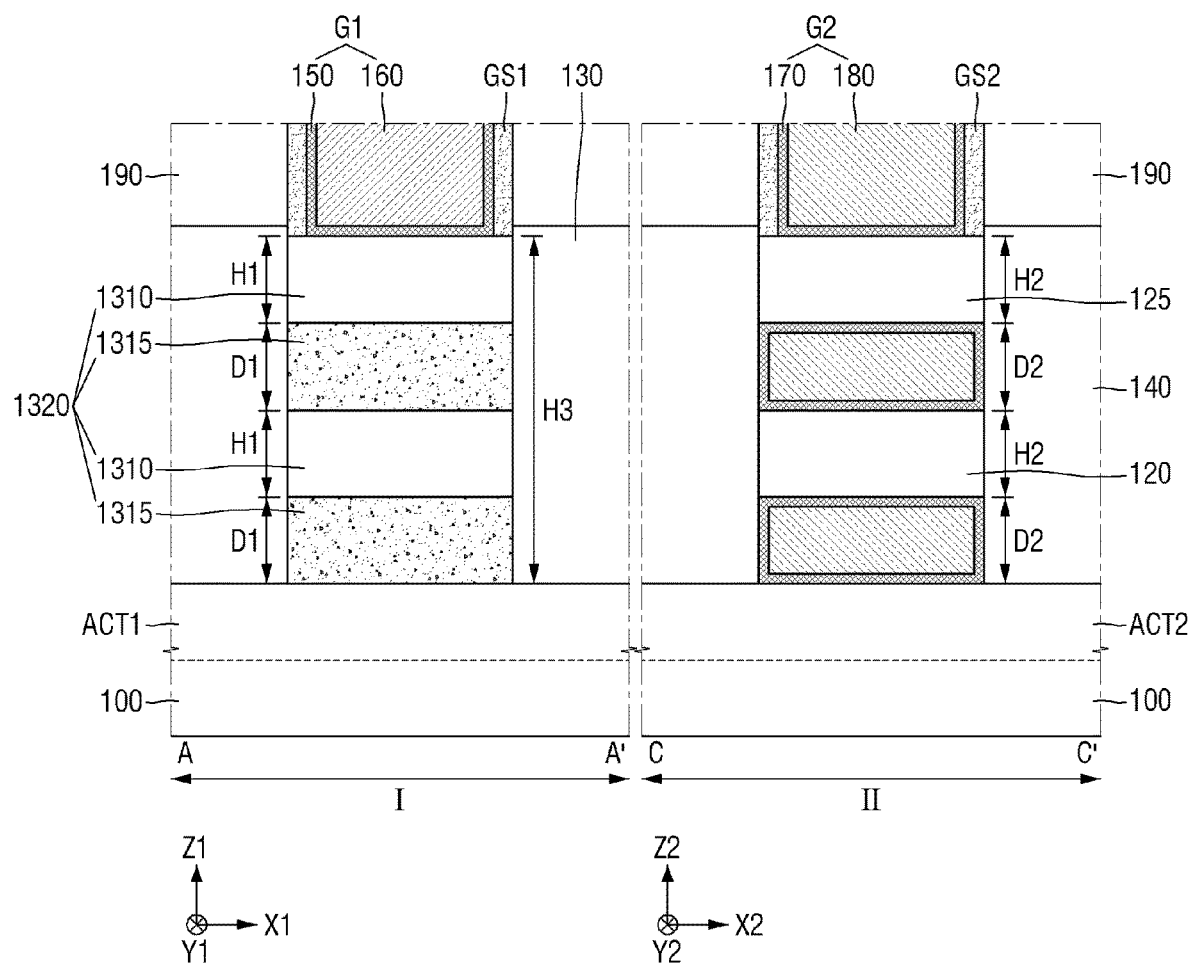
Figure 16:
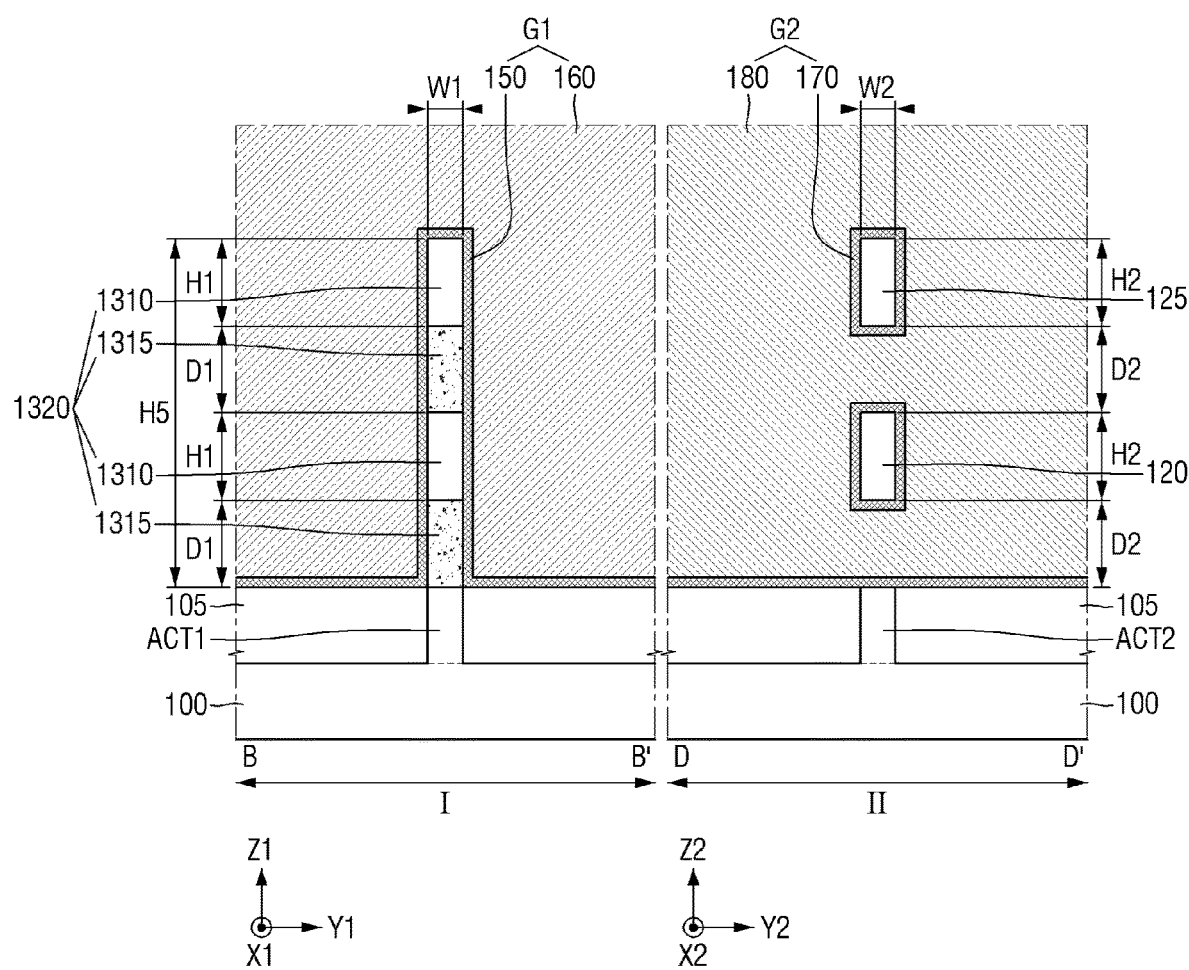

The semiconductor device according to some embodiments will be described with reference to FIGS. 10, 15, and 16. The semiconductor device according to some embodiments may include a sixth active pattern 1320, a fourth active pattern 120, a fifth active pattern 125, a first gate structure G1, a first gate spacer GS1, a second gate structure G2, a second gate spacer GS2, a first source/drain region 130, a second source/drain region 140 and an interlayer insulating film 190.

The sixth active pattern 1320 may extend in the first direction X1, in the first region I of the substrate 100. The sixth active pattern 1320 may protrude from the substrate 100 in the third direction Z1. The first gate spacer GS1 and the first gate structure G1 may extend in the second direction Y1 in the first region I of the substrate 100, and may intersect the sixth active pattern 1320. The first gate spacer GS1 and the first gate structure G1 may be formed on the sixth active pattern 1320. In addition, the first gate spacer GS1 and the first gate structure G1 may be formed on the substrate 100, and may be formed on at least one sidewall of the sixth active pattern 1320. For example, the first gate insulating film 150 may be formed along sidewalls and upper surfaces of the sixth active pattern 1320 and the upper surface of the field insulating film 105. The first gate electrode 160 may be formed on the first gate insulating film 150. The sixth active pattern 1320 has a third height H3 in the third direction Z1, and the third height H3 may be greater than the second height H2 in the sixth direction Z2 of the fourth active pattern 120 and the fifth active pattern 125.

The sixth active pattern 1320 may include a first semiconductor pattern 1310 and a second semiconductor pattern 1315. The first semiconductor pattern 1310 and the second semiconductor pattern 1315 may extend in the first direction X1. The first semiconductor pattern 1310 and the second semiconductor pattern 1315 may be alternately stacked. For example, the first semiconductor pattern 1310 may be formed on the second semiconductor pattern 1315, and another second semiconductor pattern 1315 may be formed on the first semiconductor pattern 1310. The height of the first semiconductor pattern 1310 in the third direction Z1 may be a first height H1, and the height of the second semiconductor pattern 1315 in the third direction Z1 may be a first distance D1. The first distance D1 may be substantially the same as the second distance D2 between the fourth active pattern 120 and the fifth active pattern 125. The first semiconductor pattern 1310 may be similar to the first active pattern 110 and the second active pattern 115 described earlier. The second semiconductor pattern 1315 may include the same material as the first source/drain region 130. For example, in the case where the first source/drain region 130 includes silicon germanium (SiGe), the second semiconductor pattern 1315 may include silicon germanium (SiGe). In another example, when the first source/drain region 130 includes germanium (Ge), the second semiconductor pattern 1315 may include germanium (Ge).

Since the second semiconductor pattern 1315 includes the same material as that of the first source/drain region 130, the lattice mismatch of the second semiconductor pattern 1315 from the first source/drain region 130 may be minimized/reduced. In addition, the second semiconductor pattern 1315 may function as a seed layer in the process of forming the first source/drain region 130. Also, according to some embodiments, since the second semiconductor pattern 1315 is used in the sixth active pattern 1320, the burden of etching the sacrificial layer may be reduced.

Figure 17:
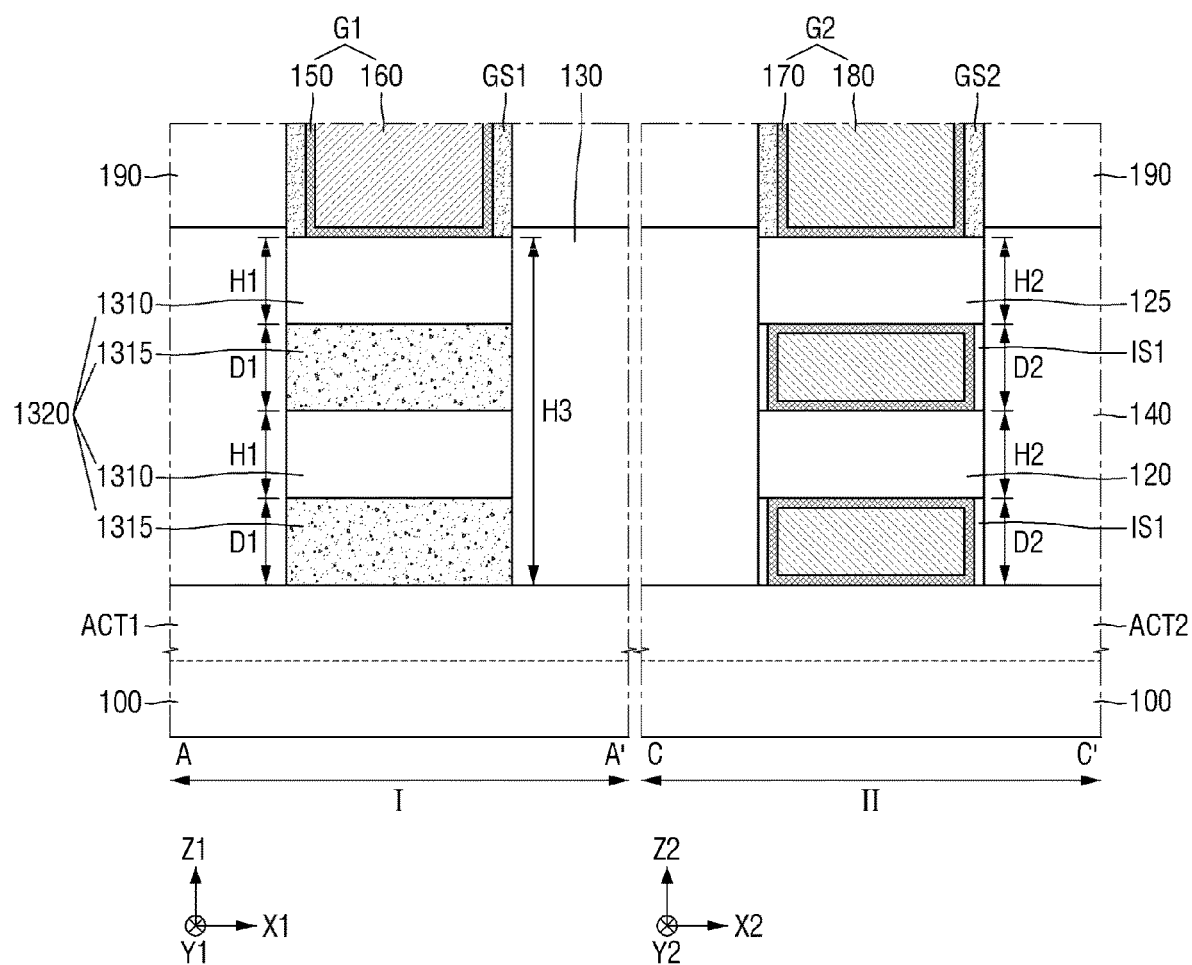

The semiconductor device according to some embodiments will be described with reference to FIGS. 10, 16, and 17. The semiconductor device according to some embodiments may further include a first spacer IS1 in the semiconductor device described above with reference to FIGS. 10 and 15 and 16. As described above, the first spacer IS1 may be formed between the second source/drain region 140 and the second gate structure G2 in the second region II of the substrate 100. In addition, the first spacer IS1 may be formed between the second active region ACT2 and the fourth active pattern 120, and between the fourth active pattern 120 and the fifth active pattern 125. According to some embodiments, the first spacer IS1 may include the same second material as the second source/drain region 140. Since the first spacer IS1 includes the same material as the second source/drain region 140, when forming the second source/drain region 140, the lattice mismatch between the first spacer IS1 and the second source/drain regions 140 may be minimized/reduced. Also, when forming the second source/drain region 140, the first spacer IS1 may function as a seed layer of the second source/drain region 140.

Figure 18:
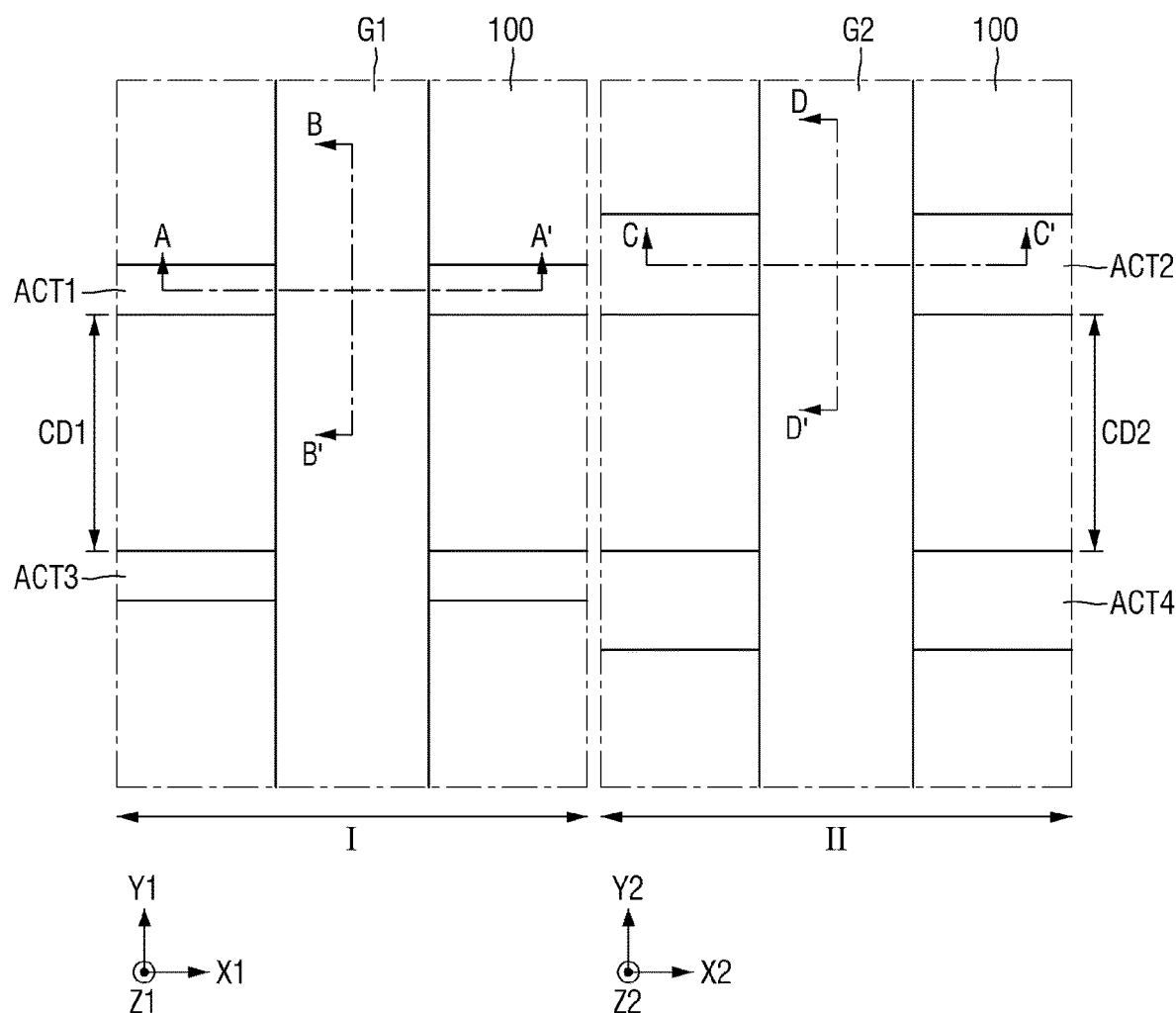
FIG. 18 is a layout diagram of a semiconductor device according to some embodiments.

FIG. 18 is a layout diagram of the semiconductor device according to some embodiments. FIGS. 19 to 23 are example cross-sectional views for explaining the semiconductor device of FIG. 18 according to some embodiments.

Figure 19:
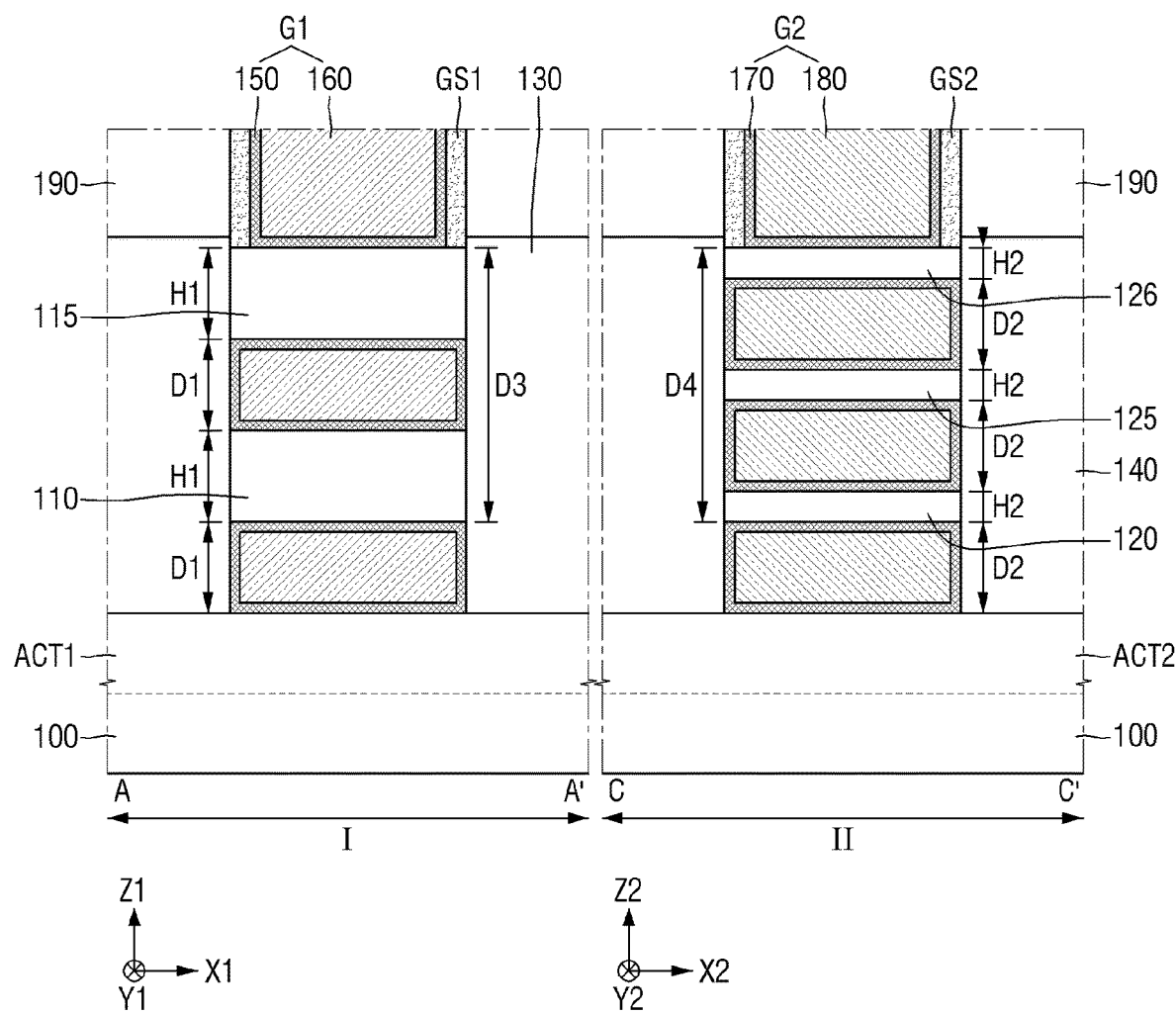
FIGS. 19 to 23 are example cross-sectional views for explaining the semiconductor device of FIG. 18 according to some embodiments.
Figure 20:
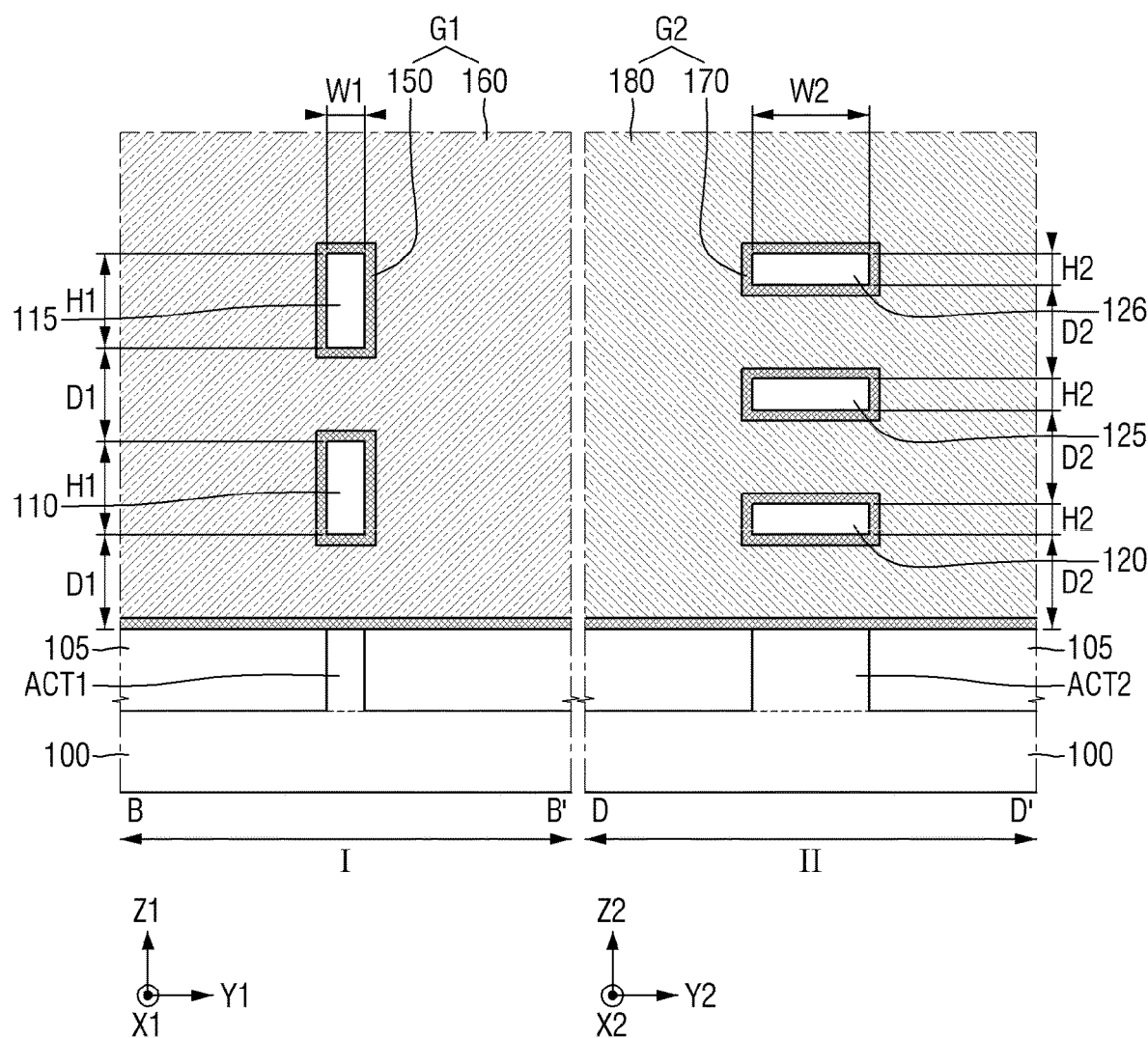

Referring to FIGS. 18, 19 and 20, in the first region I of the substrate 100, the first active region ACT1 may extend in the first direction X1. The third active region ACT3 is spaced apart from the first active region ACT1 in the second direction Y1, and may extend in the first direction X1. For example, the third active region ACT3 may be spaced apart from the first active region ACT1 in the second direction Y1 by a first critical area CD1. Similarly, the second active region ACT2 may extend in the fourth direction X2 in the second region II of the substrate 100. The fourth active region ACT4 may be spaced apart from the second active region ACT2 in the fifth direction Y2, and may extend in the fourth direction X2. The fourth active region ACT4 may be spaced apart from the second active region ACT2 in the fifth direction Y2 by a second critical area CD2. The first critical area CD1 and the second critical area CD2 may be substantially the same. As illustrated in FIG. 16, in the case where semiconductor elements are arranged with the same critical area, the degree of integration of the semiconductor element in the first region I may be improved as compared to the degree of integration of the semiconductor element in the second region II.

The first active pattern 110 and a second active pattern 115 may be formed on the first region I of the substrate 100. For example, in the first region I of the substrate 100, the first active pattern 110 may be formed on the first active region ACT1, and the second active pattern 115 may be formed on the first active pattern 110. The first active pattern 110 and the second active pattern 115 may be spaced part from each other in the third direction Z1 by the first distance D1. The first active pattern 110 and the second active pattern 115 may have the first width W1 in the second direction Y1 and the first height H1 in the third direction Z1.

The fourth active pattern 120, the fifth active pattern 125 and the seventh active pattern 126 may be formed on the second region II of the substrate 100. For example, in the second region II of the substrate 100, the fourth active pattern 120 may be formed on the second active region ACT2, the fifth active pattern 125 may be formed on the fourth active pattern 120, and the seventh active pattern 126 may be formed on the fifth active pattern 125. The fourth active pattern 120 is spaced apart from the second active region ACT2 in the sixth direction Z2 by the second distance D2, the fifth active pattern 125 is spaced apart from the fourth active pattern 120 in the sixth direction Z2 by the second distance D2, and the seventh active pattern 126 may be spaced apart from the fifth active pattern 125 in the sixth direction Z2 by the second distance D2. The fourth active pattern 120, the fifth active pattern 125, and the seventh active pattern 126 may have the second width W2 in the fifth direction Y2 and the second height H2 in the sixth direction Z2, respectively.

The first width W1 of the first active pattern 110 and the second active pattern 115 may be smaller than the first height H1. On the other hand, the second width W2 of the fourth active pattern 120, the fifth active pattern 125 and the seventh active pattern 126 may be greater than the second height H2. The first height H1 of the first active pattern 110 and the second active pattern 115 may be greater than the second height H2 of the fourth active pattern 120, the fifth active pattern 125 and the seventh active pattern 126. For example, the first height H1 may be substantially the same as the second width W2. Also, for example, the first width W1 may be substantially the same as the second height H2. However, the present inventive concepts are not limited thereto, and the first height H1 and the second width W2 may be different from each other, and the first width W1 and the second height H2 may be different from each other, respectively. For example, the ratio of the first height H1, the first distance D1 and the second distance D2 may be approximately 1:1:1. For example, the ratio of the second height H2 to the second width W2 may be approximately 1:3. However, the present inventive concepts are not limited thereto.

A third distance D3 from a lower surface of the first active pattern 110 to the upper surface of the second active pattern 115 may be substantially the same as a fourth distance D4 from a lower surface of the fourth active pattern 120 to the upper surface of the seventh active pattern 126. In other words, in some embodiments, the semiconductor elements included in the first region I and the second region II of the substrate 100 may have the structure of the same height.

However, the number of active patterns included in the first region I of the substrate 100 may be smaller than the number of active patterns included in the second region II.

The first region I of the semiconductor device according to some embodiments includes two active patterns, and the second region II includes three active patterns. However, the present inventive concepts are not limited thereto, and those having ordinary knowledge in the technical field of the present inventive concepts may appropriately set the number of active patterns included in the first region I and the second region II. According to some embodiments, under the same height condition, since the number of active patterns included in the first region I is smaller than the number of active patterns included in the second region II, the driving current of the semiconductor element included in the second region II may be greater than the driving current of the semiconductor element included in the first region I. On the other hand, in terms of power consumption, the power consumption of the semiconductor element included in the first region I may be smaller than the power consumption of the semiconductor element included in the second region II. A person having ordinary knowledge in the technical field of the present inventive concepts may properly arrange the semiconductor elements that satisfy the requirements in each region, by setting a region requiring/using the low power consumption as the first region I, and by setting a region requiring/using the large driving current as the second region II.

Figure 21:
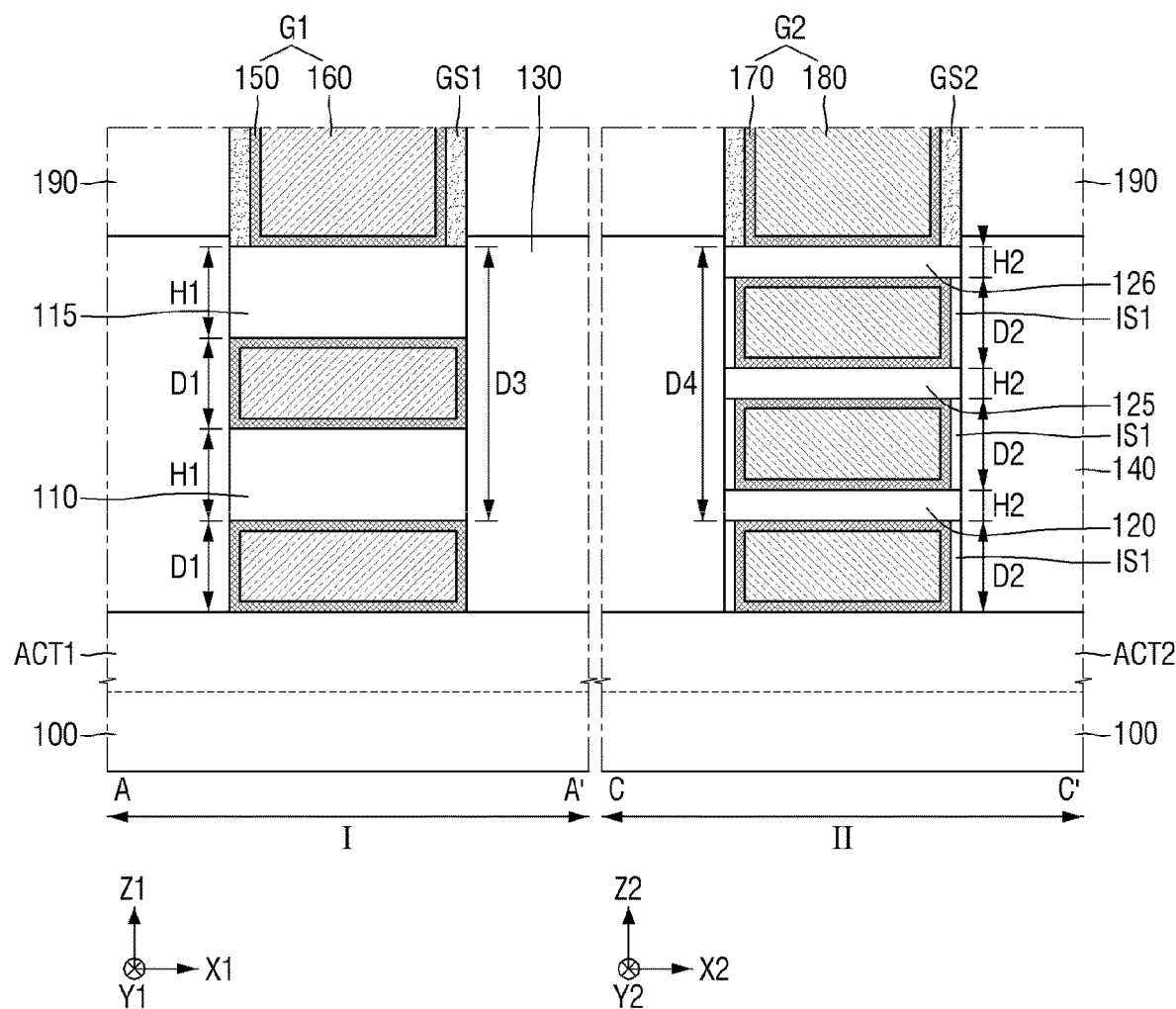

The semiconductor device according to some embodiments will be described referring to FIGS. 18, 20 and 21. The semiconductor device according to some embodiments may further include a first spacer IS1 in the semiconductor device described above with reference to FIGS. 18, 19 and 20. As described above, the first spacer IS1 may be formed between the second source/drain region 140 and the second gate structure G2 in the second region II of the substrate 100. In addition, the first spacer IS1 may be formed between the second active region ACT2 and the fourth active pattern 120, between the fourth active pattern 120 and the fifth active pattern 125, and between the fifth active pattern 125 and the seventh active pattern 126. According to some embodiments, the first spacer IS1 may include the same second material as the second source/drain region 140. Since the first spacer IS1 includes the same material as the second source/drain region 140, when forming the second source/drain region 140, the lattice mismatch between the first spacer IS1 and the second source/drain regions 140 may be minimized/reduced. Also, when forming the second source/drain region 140, the first spacer IS1 may function as a seed layer of the second source/drain region 140.

Figure 22:
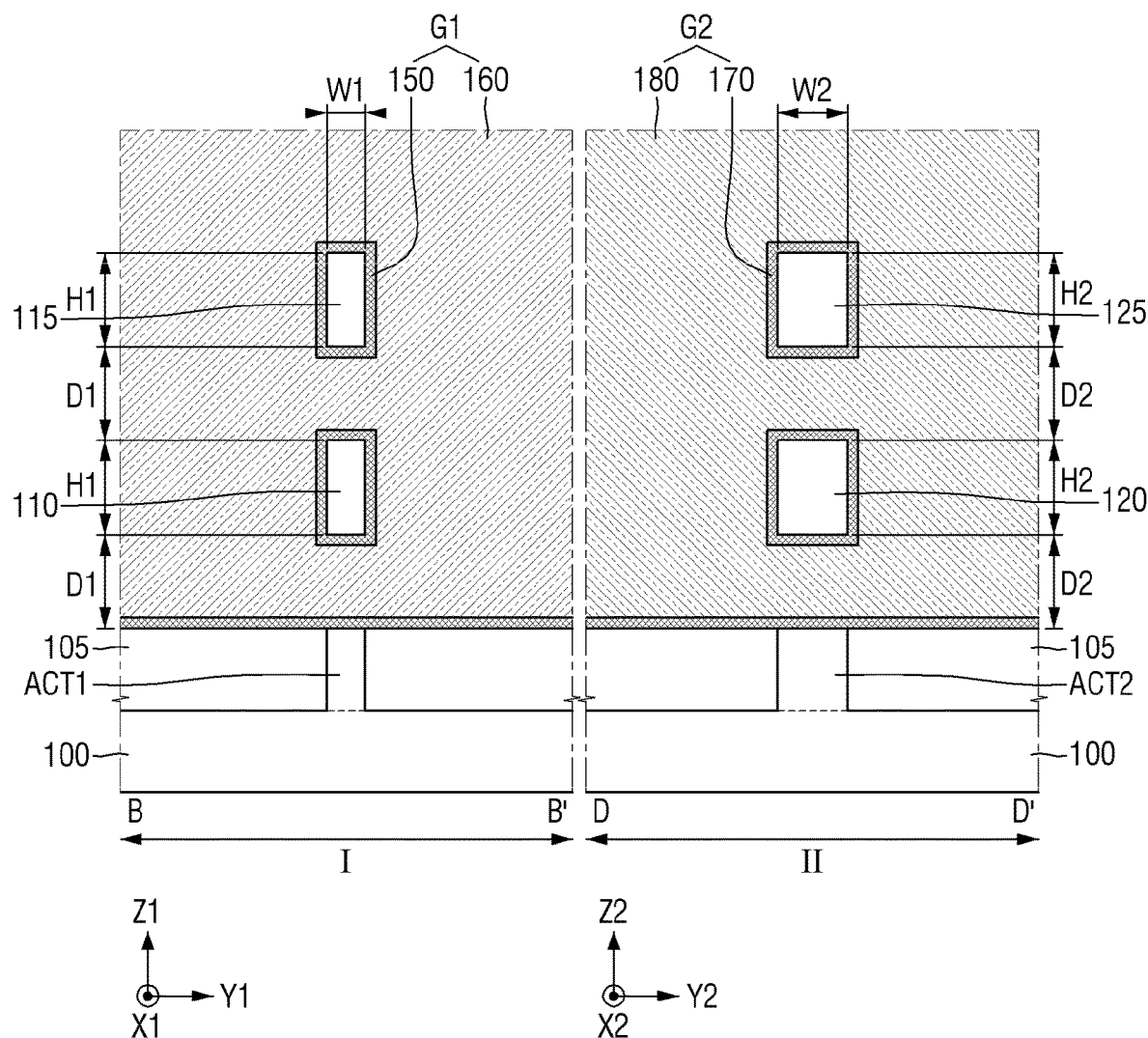

Referring to FIGS. 18 and 22, the semiconductor device according to some embodiments may include the first active pattern 110, the second active pattern 115, the fourth active pattern 120, and the fifth active pattern 125. The first active pattern 110 and the second active pattern 115 may have a first height H1 in the third direction Z1, and a first width W1 in the second direction Y1. The first height H1 may be greater than the first width W1. The fourth active pattern 120 and the fifth active pattern 125 may have a second height H2 in the sixth direction Z2, and a second width W2 in the fifth direction Y2. The second height H2 may be greater than the second width W2. According to some embodiments, the first height H1 and the second height H2 may be substantially identical to each other. On the other hand, according to some embodiments, the first width W1 may be smaller than the second width W2.

Figure 23:
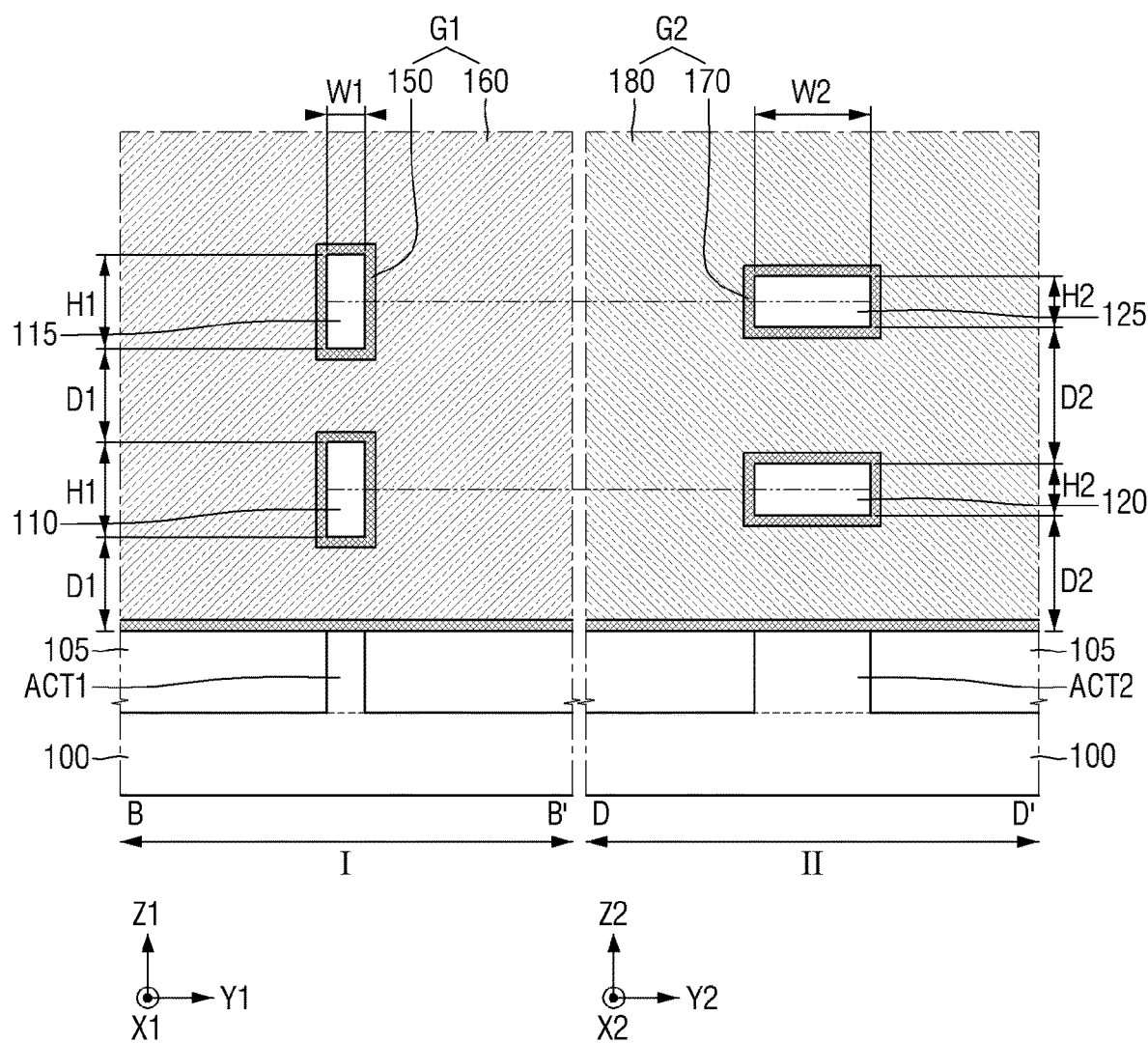

Referring to FIGS. 18 and 23, the semiconductor device according to some embodiments may include the first active pattern 110, the second active pattern 115, the fourth active pattern 120, and the fifth active pattern 125. The first active pattern 110 and the second active pattern 115 may have the first height H1 in the third direction Z1 and the first width W1 in the second direction Y1. The first height H1 may be greater than the first width W1. The fourth active pattern 120 and the fifth active pattern 125 may have the second height H2 in the sixth direction Z2, and the second width W2 in the fifth direction Y2. The second height H2 may be smaller than the second width W2. According to some embodiments, the first height H1 may be greater than the second height H2. The first width W1 may be smaller than the second width W2. According to some embodiments, a centerline passing through the centers of the first active pattern 110 and the second active pattern 115 and extending in the second direction Y1 may be connected to a centerline passing through the fourth active pattern 120 and the fifth active pattern 125 and extending in the fifth direction Y2. In other words, each of centers of the first active pattern 110 and the second active pattern 115 may be aligned with the centers of the fourth active pattern 120 and the fifth active pattern 125.

Figure 24:
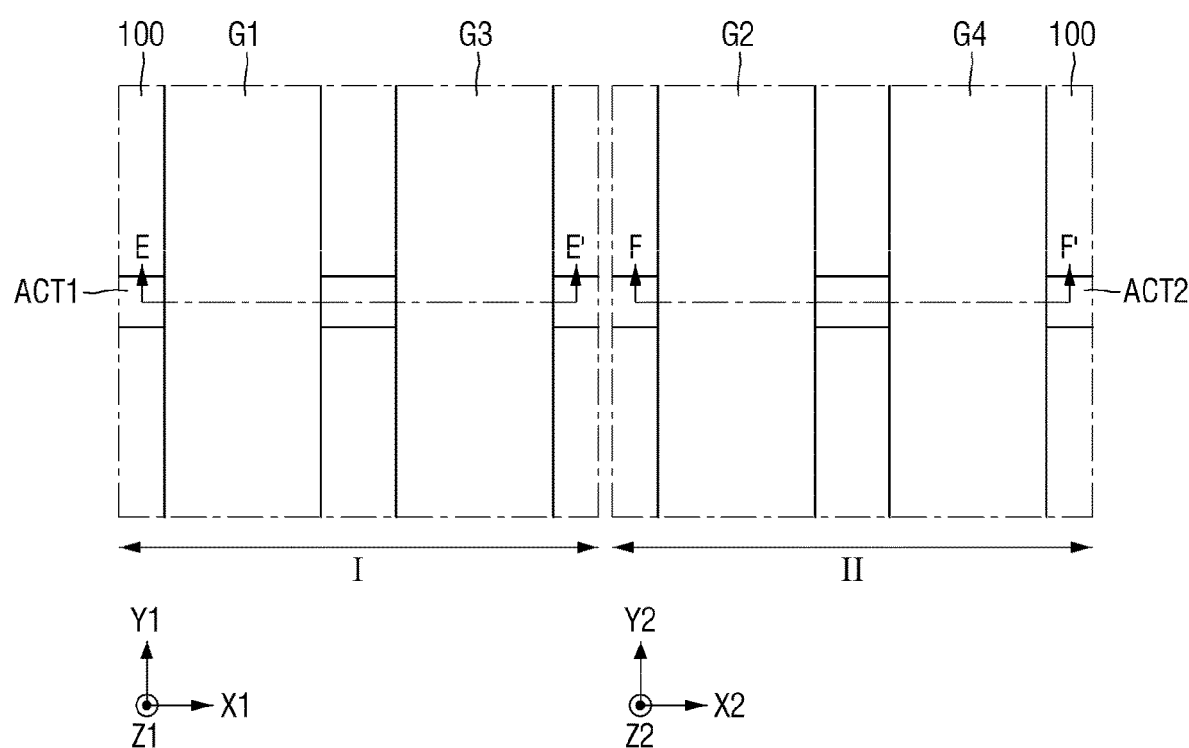
FIG. 24 is a layout diagram of a semiconductor device according to some embodiments.
Figure 25:
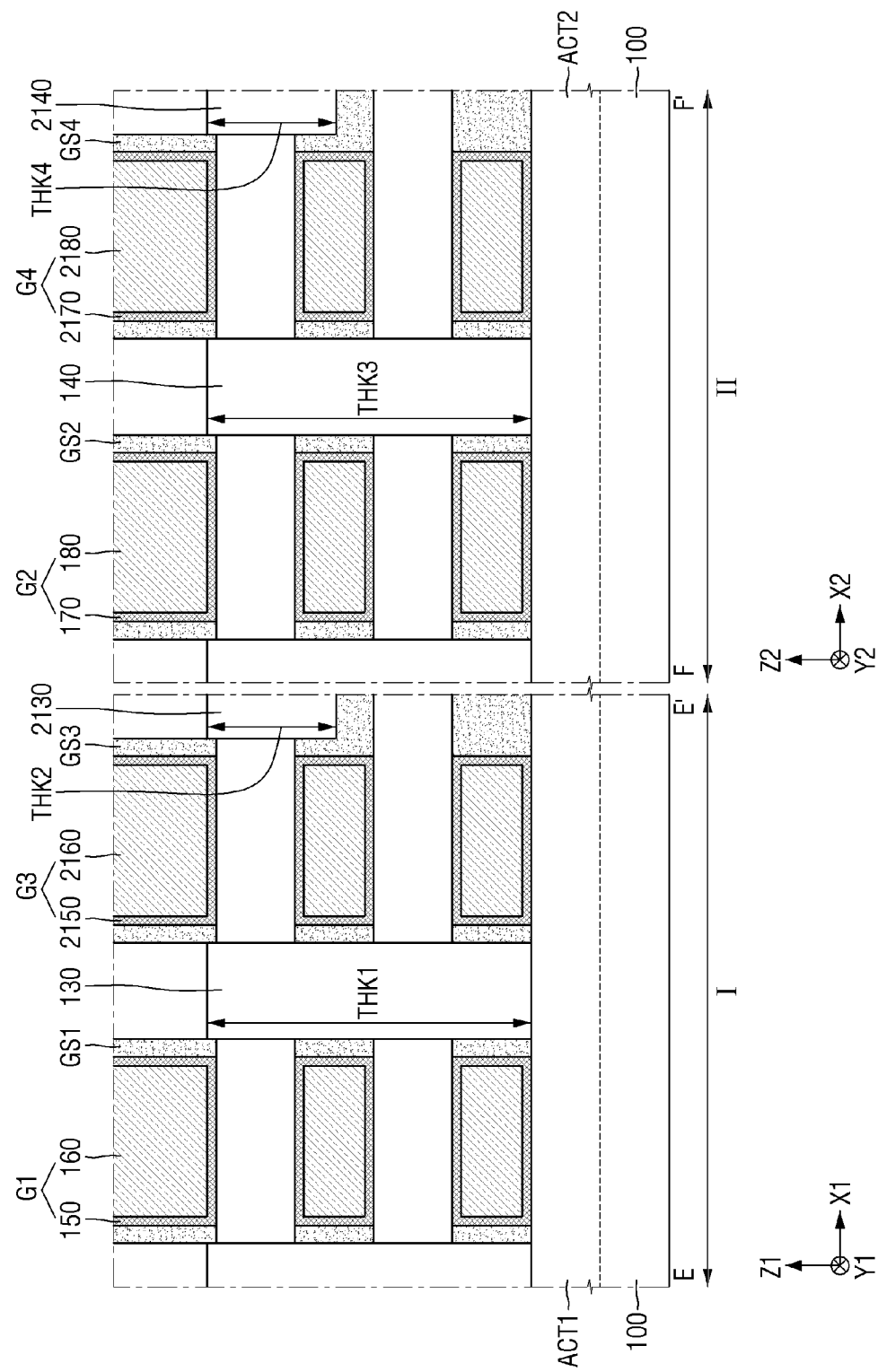
FIG. 25 is a cross-sectional view taken along lines E-E' and F-F' of FIG. 24.

FIG. 24 is a layout diagram of the semiconductor device according to some embodiments. FIG. 25 is a cross-sectional view taken along lines E-E' and F-F' of FIG. 24.

The semiconductor device according to some embodiments will be described with reference to FIGS. 24 and 25. The first active region ACT1 may extend in the first direction X1 on the first region I of the substrate 100. The first gate structure G1 and the first gate spacer GS1 extend in the second direction Y1 and may intersect the first active region ACT1. The third gate structure G3 and the third gate spacer GS3 may be spaced apart from the first gate structure G1 in the first direction X1 and extend in the second direction Y1 to intersect the first active region ACT1. The third gate structure G3 may include a third gate insulating film 2150 and a third gate electrode 2160. The first source/drain region 130 and the third source/drain region 2130 may be spaced apart from each other in the first direction X1. The first source/drain region 130 may be electrically connected to the first active pattern 110 and the second active pattern 115. The third source/drain region 2130 is not electrically connected to the first active pattern 110 but may be electrically connected only to the second active pattern 115. In other words, the first source/drain region 130 has a first thickness THK1 in the third direction Z1, and the third source/drain region 2130 may have a second thickness THK2 in the third direction Z1. The first thickness THK1 may be greater than the second thickness THK2.

Similarly, the second active region ACT2 may extend in the fourth direction X2 on the second region II of the substrate 100. The second gate structure G2 and the second gate spacer GS2 extend in the fifth direction Y2 and may intersect the second active region ACT2. The fourth gate structure G4 and the fourth gate spacer GS4 may be spaced apart from the second gate structure G2 in the fourth direction X2 and extend in the fifth direction Y2 to intersect the second active region ACT2. The fourth gate structure G4 may include a fourth gate insulating film 2170 and a fourth gate electrode 2180. The second source/drain region 140 and the fourth source/drain region 2140 may be formed to be spaced apart from each other in the fourth direction X2. The second source/drain region 140 may be electrically connected to the fourth active pattern 120 and the fifth active pattern 125. The fourth source/drain region 2140 is not electrically connected to the fourth active pattern 120 but may be electrically connected only to the fifth active pattern 125. In other words, the second source/drain region 140 has a third thickness THK3 in the sixth direction Z2, and the fourth source/drain region 2140 may have a fourth thickness THK4 in the sixth direction Z2. The third thickness THK3 may be greater than the fourth thickness THK4.

Figure 26:
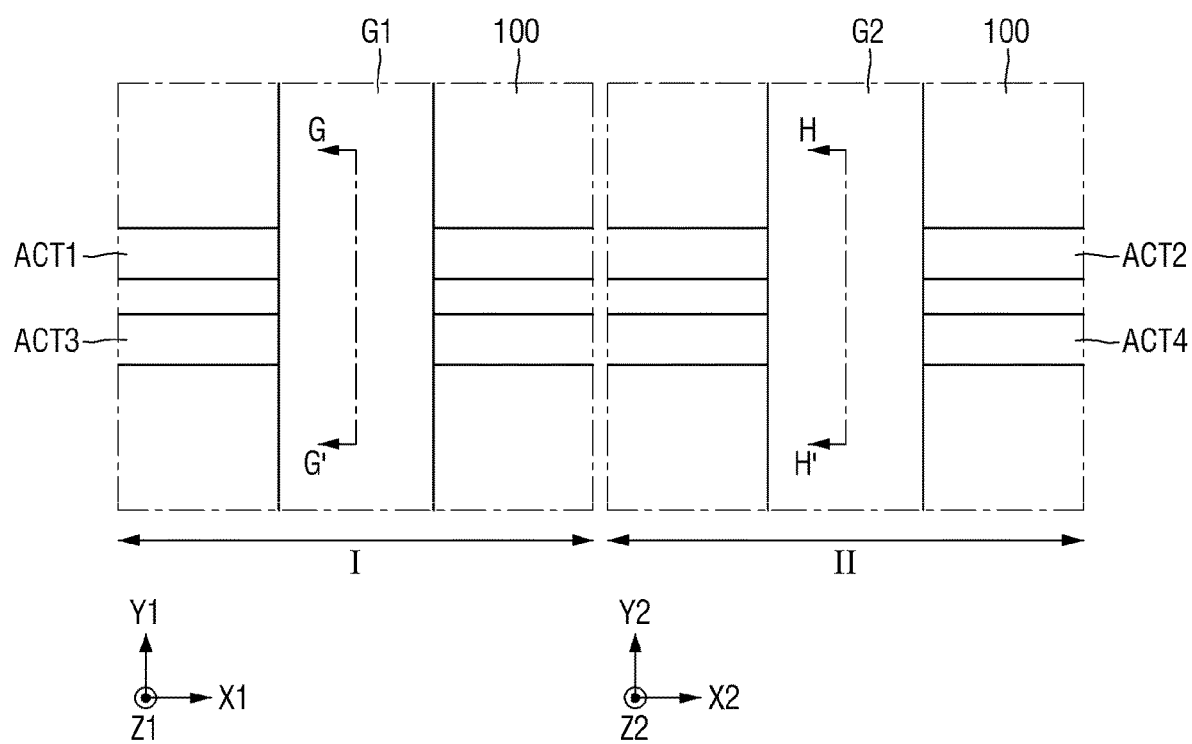
FIG. 26 is a layout diagram of a semiconductor device according to some embodiments.
Figure 27:
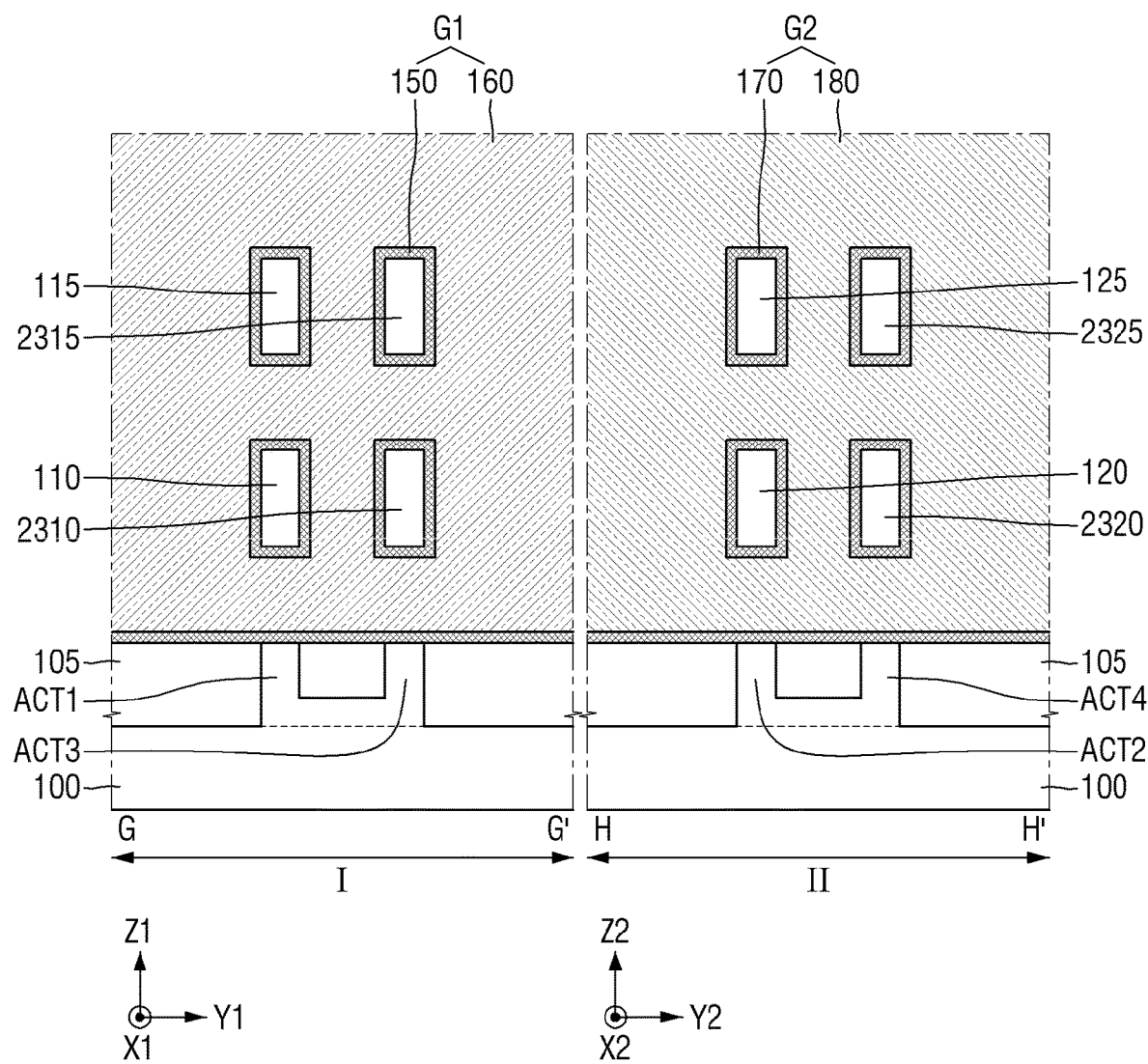
FIGS. 27 and 28 are cross-sectional views taken along lines G-G' and H-H' of FIG. 26, respectively.
Figure 28:
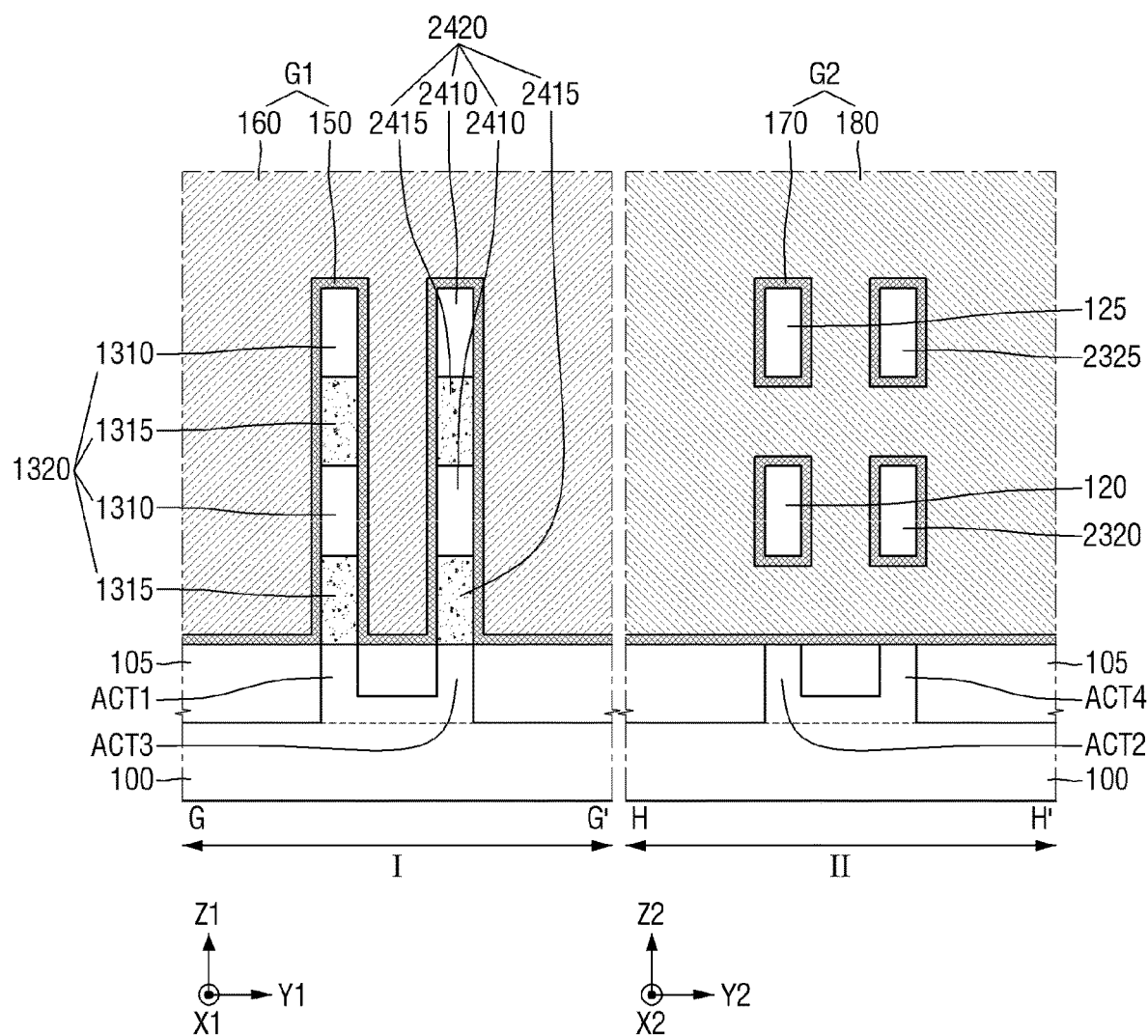

FIG. 26 is a layout diagram of the semiconductor device according to some embodiments. FIGS. 27 and 28 are cross-sectional views taken along lines G-G' and H-H' of FIG. 26, respectively.

The semiconductor device according to some embodiments will be described with reference to FIGS. 26 and 27. The first active region ACT1 and the third active region ACT3 are spaced apart from each other on the first region I of the substrate 100 and may extend in the first direction X1, respectively. The second active region ACT2 and the fourth active region ACT4 are spaced apart from each other on the second region II of the substrate 100 and may extend in the fourth direction X2, respectively. The first gate structure G1 extends in the second direction Y1 and may intersect the first active region ACT1 and the third active region ACT3. The second gate structure G2 extends in the fifth direction Y2 and may intersect the second active region ACT2 and the fourth active region ACT4.

The first active pattern 110 may be formed on the first active region ACT1, and the second active pattern 115 may be formed on the first active pattern 110. An eighth active pattern 2310 may be formed on the third active region ACT3, and a ninth active pattern 2315 may be formed on the eighth active pattern 2310. The eighth active pattern 2310 and the ninth active pattern 2315 may be similar to the first active pattern 110 and the second active pattern 115, respectively. The first gate structure G1 may be formed to cover all of the first active pattern 110, the second active pattern 115, the eighth active pattern 2310 and the ninth active pattern 2315. In other words, each of the first active pattern 110, the second active pattern 115, the eighth active pattern 2310, and the ninth active pattern 2315 may penetrate through the first gate structure G1.

The fourth active pattern 120 may be formed on the second active region ACT2 and the fifth active pattern 125 may be formed on the fourth active pattern 120. A tenth active pattern 2320 may be formed on the fourth active region ACT4, and an eleventh active pattern 2325 may be formed on the tenth active pattern 2320. The tenth active pattern 2320 and the eleventh active pattern 2325 may be similar to the fourth active pattern 120 and the fifth active pattern 125, respectively. The second gate structure G2 may be formed to cover all of the fourth active pattern 120, the fifth active pattern 125, the tenth active pattern 2320 and the eleventh active pattern 2325. In other words, each of the fourth active pattern 120, the fifth active pattern 125, the tenth active pattern 2320, and the eleventh active pattern 2325 may penetrate through the second gate structure G2.

The semiconductor device according to some embodiments will be described with reference to FIGS. 26 and 28. A sixth active pattern 1320 may be formed on the first active region ACT1. A twelfth active pattern 2420 may be formed on the third active region ACT3. The sixth active pattern 1320 may include a first semiconductor pattern 1310 and a second semiconductor pattern 1315 that are alternately stacked. The twelfth active pattern 2420 may include a third semiconductor pattern 2410 and a fourth semiconductor pattern 2415 that are alternately stacked. The third semiconductor pattern 2410 and the fourth semiconductor pattern 2415 may be similar to the first semiconductor pattern 1310 and the second semiconductor pattern 1315, respectively.

That is, the twelfth active pattern 2420 may be similar to the sixth active pattern 1320. The first gate structure G1 may be formed on the sixth active pattern 1320 and the twelfth active pattern 2420. In addition, the first gate structure G1 may be formed between the sixth active pattern 1320 and the twelfth active pattern 2420. In addition, the first gate structure G1 may be formed on the field insulating film 105.

The fourth active pattern 120 may be formed on the second active region ACT2, and the fifth active pattern 125 may be formed on the fourth active pattern 120. A tenth active pattern 2320 may be formed on the fourth active region ACT4, and an eleventh active pattern 2325 may be formed on the tenth active pattern 2320. The second gate structure G2 may be formed to cover all of the fourth active pattern 120, the fifth active pattern 125, the tenth active pattern 2320 and the eleventh active pattern 2325.

Figure 29:
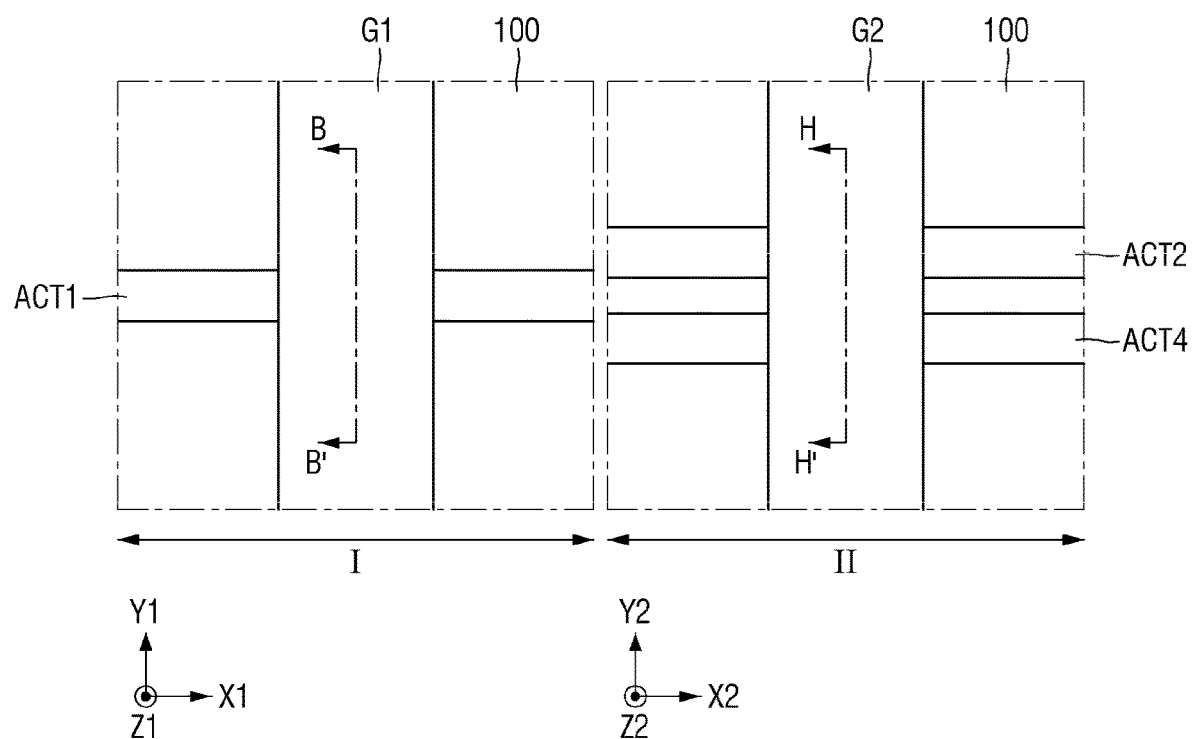
FIG. 29 is a layout diagram of a semiconductor device according to some embodiments.
Figure 30:
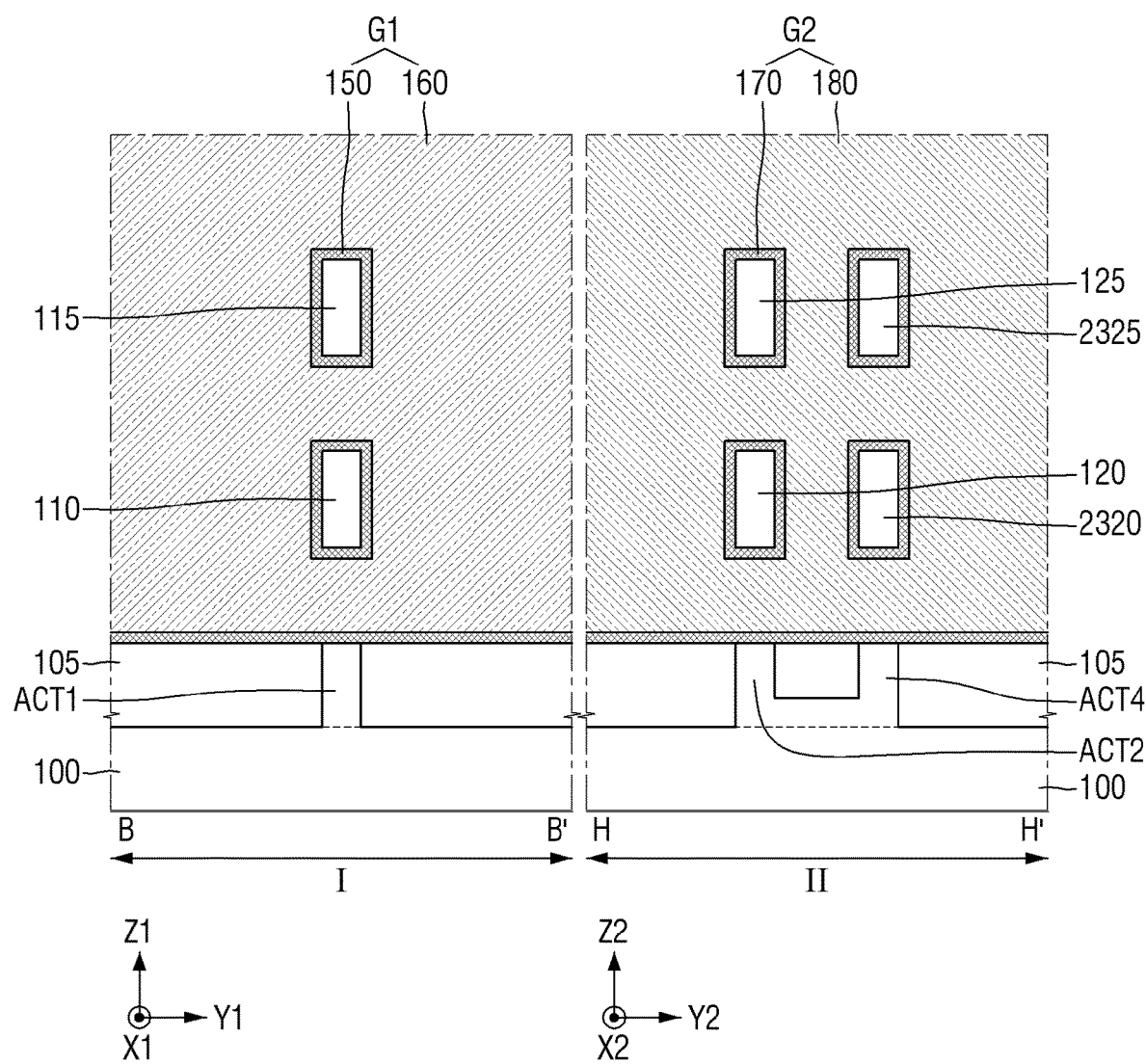
FIGS. 30 and 31 are cross-sectional views taken along lines B-B' and H-H' of FIG. 29.
Figure 31:
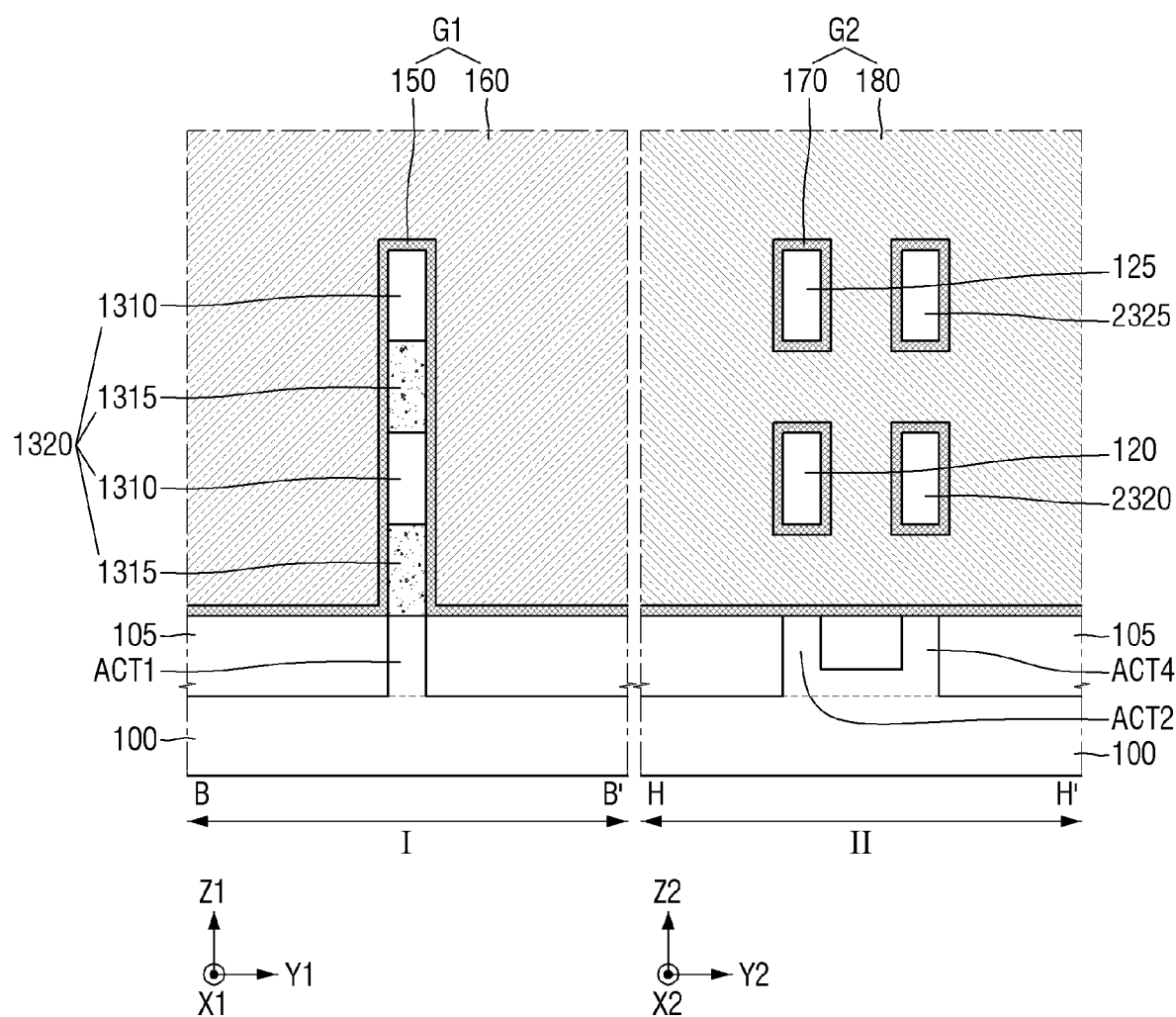

FIG. 29 is a layout diagram of the semiconductor device according to some embodiments. FIGS. 30 and 31 are cross-sectional views taken along lines B-B' and H-H' of FIG. 29.

The semiconductor device according to some embodiments will be described with reference to FIGS. 29 and 30. The first active region ACT1 may extend in the first direction X1 on the first region I of the substrate 100. The second active region ACT2 and the fourth active region ACT4 are spaced apart from each other on the second region II of the substrate 100 and may extend in the fourth direction X2, respectively. The first gate structure G1 extends in the second direction Y1 and may intersect the first active region ACT1. The second gate structure G2 extends in the fifth direction Y2 and may intersect the second active region ACT2 and the fourth active region ACT4.

The first active pattern 110 and the second active pattern 115 may be formed on the first active region ACT1. The first gate structure G1 may be formed to cover both the first active pattern 110 and the second active pattern 115. The fourth active pattern 120 may be formed on the second active region ACT2, and the fifth active pattern 125 may be formed on the fourth active pattern 120. The tenth active pattern 2320 may be formed on the fourth active region ACT4, and the eleventh active pattern 2325 may be formed on the tenth active pattern 2320. The second gate structure G2 may be formed to cover all of the fourth active pattern 120, the fifth active pattern 125, the tenth active pattern 2320 and the eleventh active pattern 2325.

The semiconductor device according to some embodiments will be described with reference to FIGS. 29 and 31. According to some embodiments, the sixth active pattern 1320 may be formed on the first active region ACT1. The first gate structure G1 may be formed on the sixth active pattern 1320. The fourth active pattern 120 may be formed on the second active region ACT2, and the fifth active pattern 125 may be formed on the fourth active pattern 120. The tenth active pattern 2320 may be formed on the fourth active region ACT4, and the eleventh active pattern 2325 may be formed on the tenth active pattern 2320. The second gate structure G2 may be formed to cover all of the fourth active pattern 120, the fifth active pattern 125, the tenth active pattern 2320 and the eleventh active pattern 2325.

FIGS. 32 to 36 are intermediate stage diagrams for explaining a method of fabricating a semiconductor device according to some embodiments, respectively.

Referring to FIGS. 32 to 36, a sacrificial layer 2815 and a first semiconductor layer 2810 are alternately stacked on the substrate 100.

The sacrificial layer 2815 and the first semiconductor layer 2810 are etched to define the first active region ACT1, the second active region ACT2, the first semiconductor pattern 1310 and the second semiconductor pattern 1315. A field insulating film 105 is formed on sidewalls of the first active region ACT1 and the second active region ACT2. A dummy gate structure DG is formed on the substrate 100. The dummy gate structure DG may include a dummy gate electrode DGE, a dummy gate spacer DGS and a capping film CP. A space in which the first source/drain region 130 and the second source/drain region 140 are formed is defined, using the dummy gate structure DG as an etching mask. The first source/drain region 130 and the second source/drain region 140 are formed, and the capping film CP is removed. A first recess RC1 and a second recess RC2 are defined by etching the dummy gate electrode DGE and the second semiconductor pattern 1315. The first gate structure G1 and the second gate structure G2 are formed in each of the first recess RC1 and the second recess RC2, and an interlayer insulating film 190 is formed, thereby fabricating the semiconductor device according to some embodiments.

Figure 34:
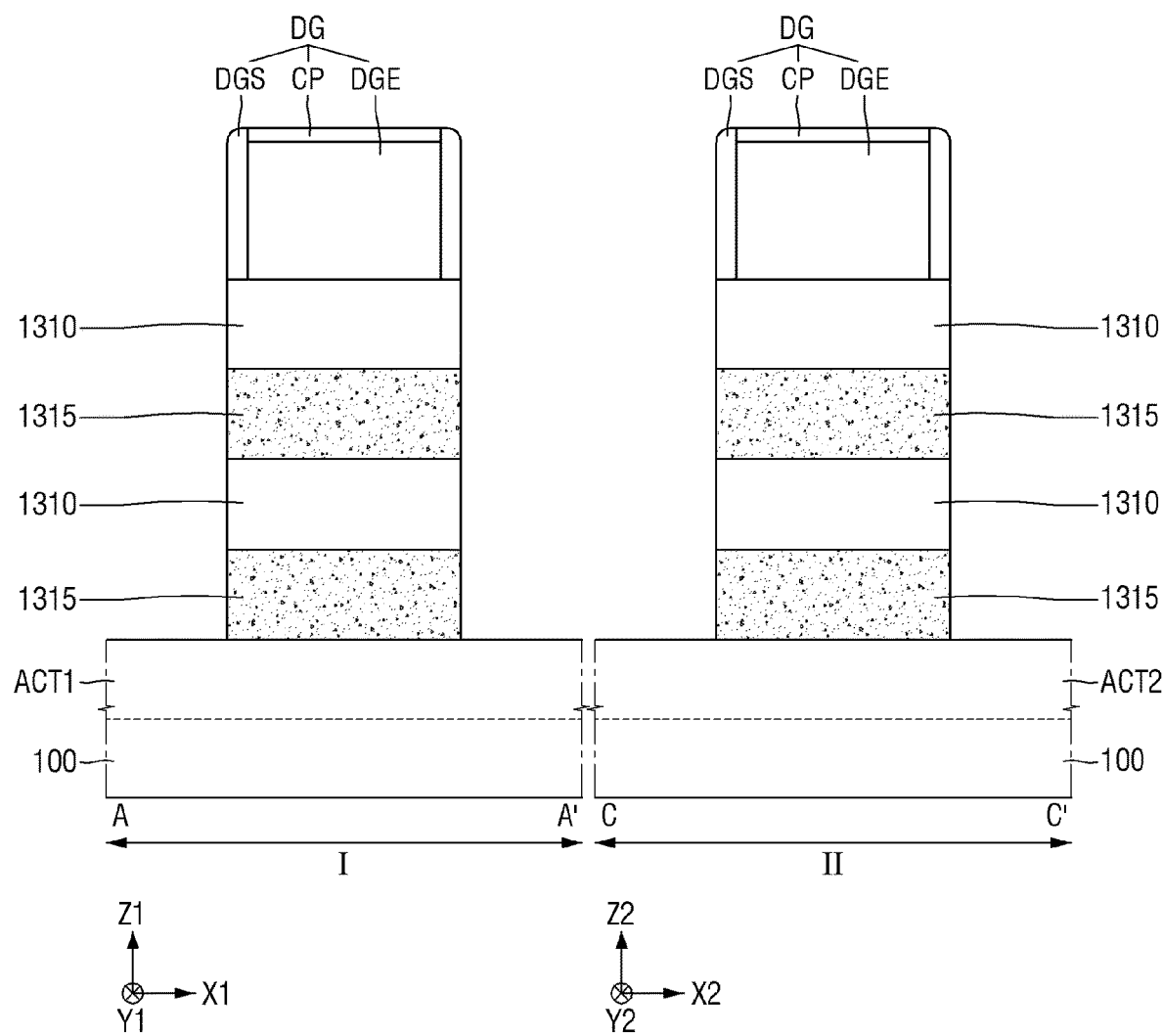
Figure 35:
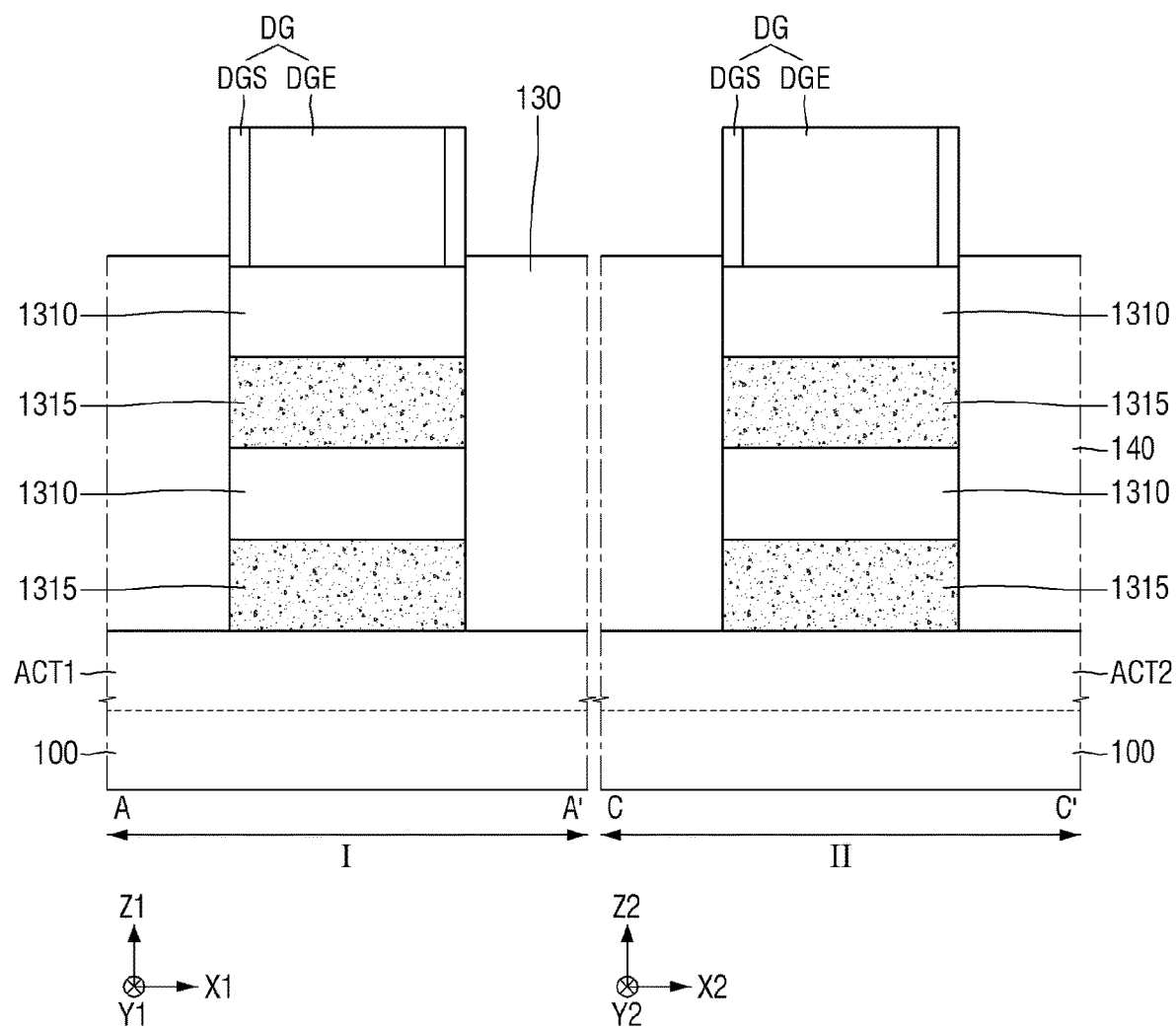
Figure 36:
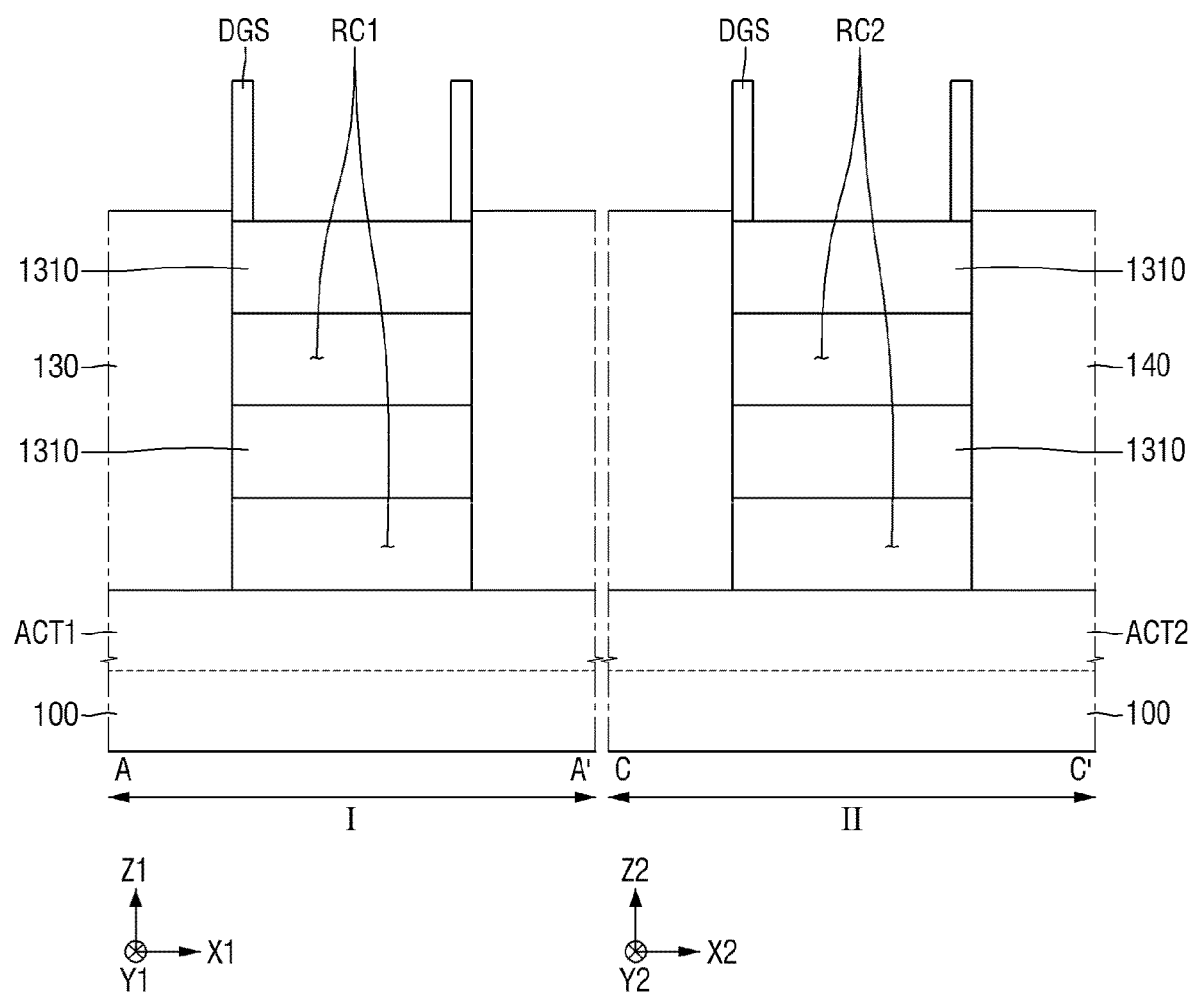
Figure 37:
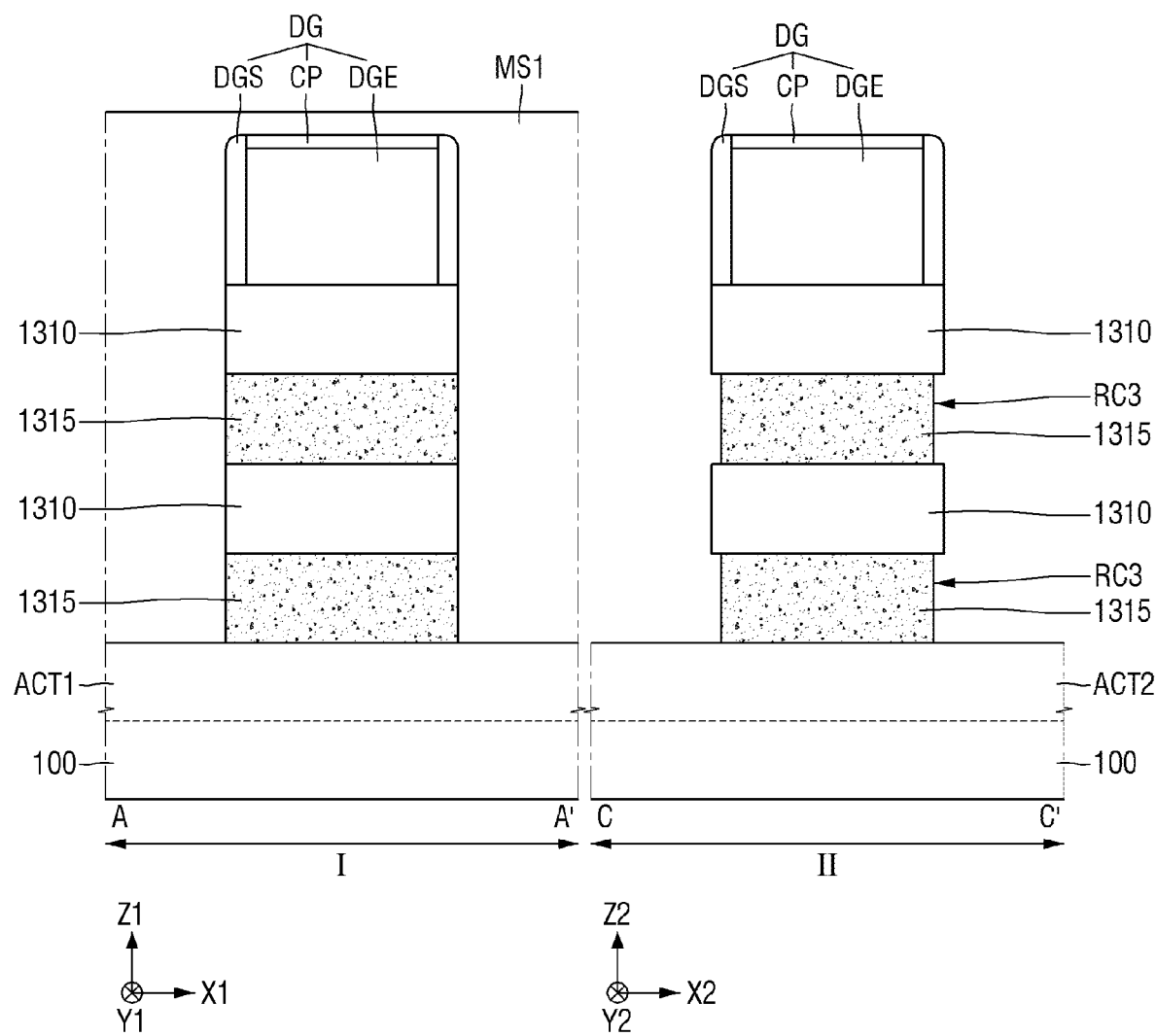
FIGS. 37 and 38 are intermediate phase diagrams for explaining a method of fabricating a first spacer according to some embodiments.
Figure 38:
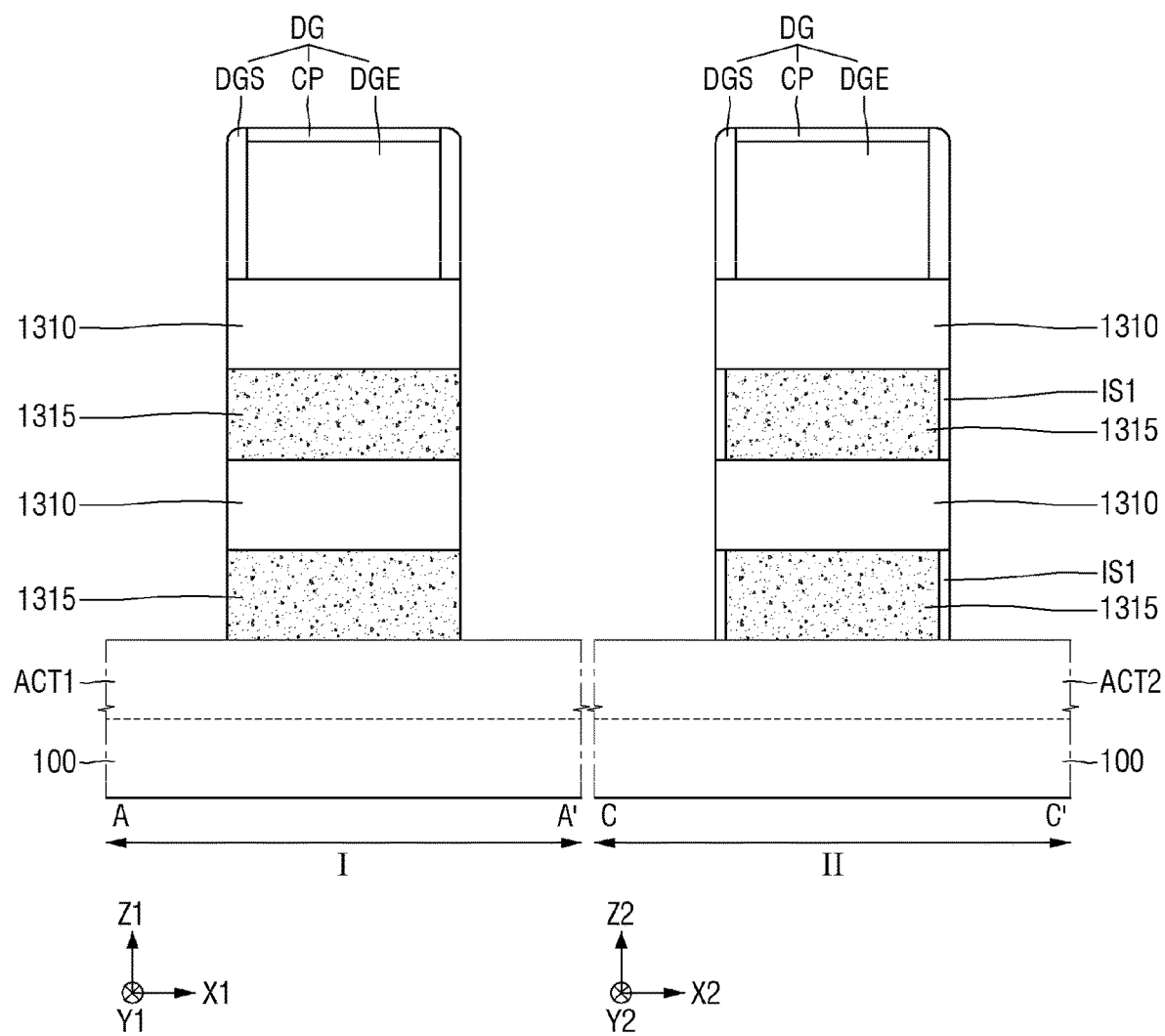

FIGS. 37 and 38 are intermediate phase diagrams for explaining a method of fabricating a first spacer according to some embodiments. Referring to FIGS. 34, 37 and 38, before forming the first source/drain region 130 and the second source/drain region 140, a first mask MS1 is formed in the first region I of the substrate 100. Subsequently, a part of the second semiconductor pattern 1315 in the second region II of the substrate 100 is etched to define a third recess RC3. The third recess RC3 is filled to form the first spacer IS1. Subsequently, the first mask MS1 is removed and the subsequent processes are performed to fabricate the semiconductor device according to some embodiments.

Figure 32:
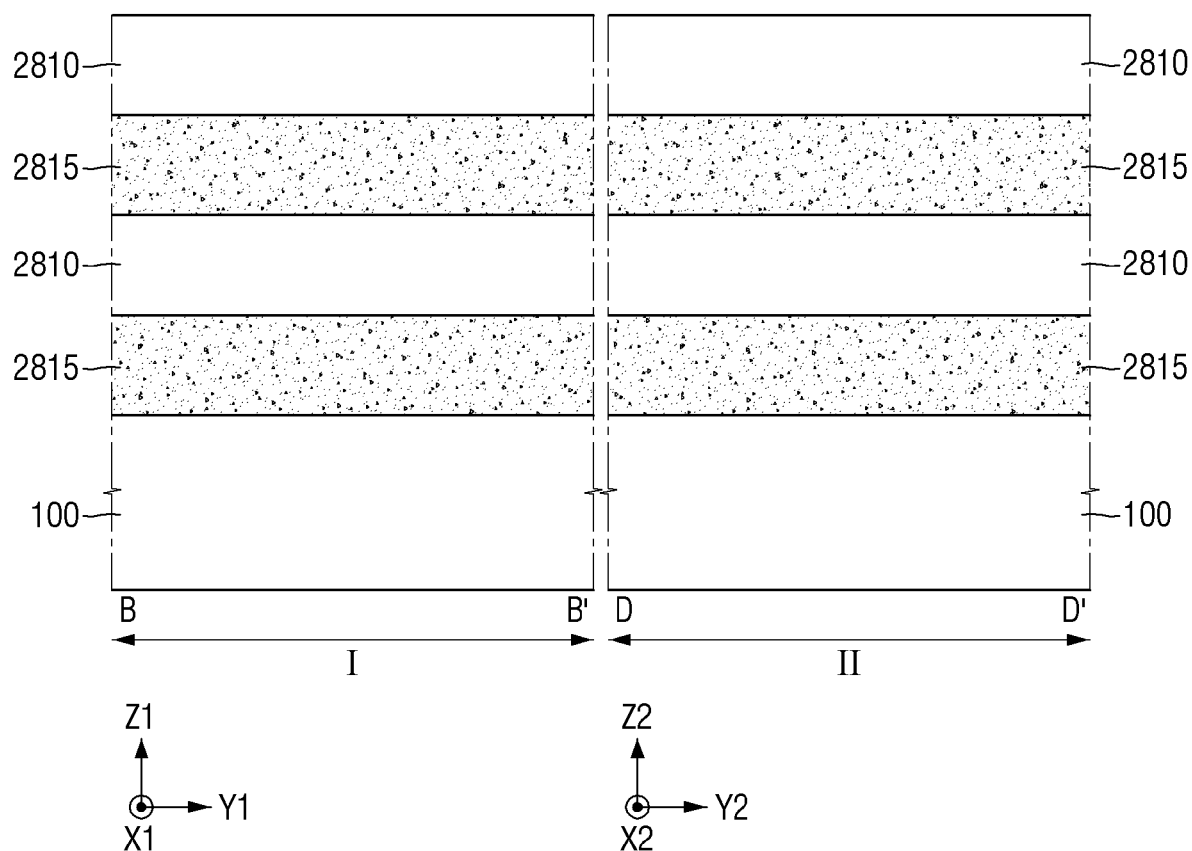
FIGS. 32 to 36 are intermediate stage diagrams for explaining a method of fabricating a semiconductor device according to some embodiments, respectively.
Figure 33:
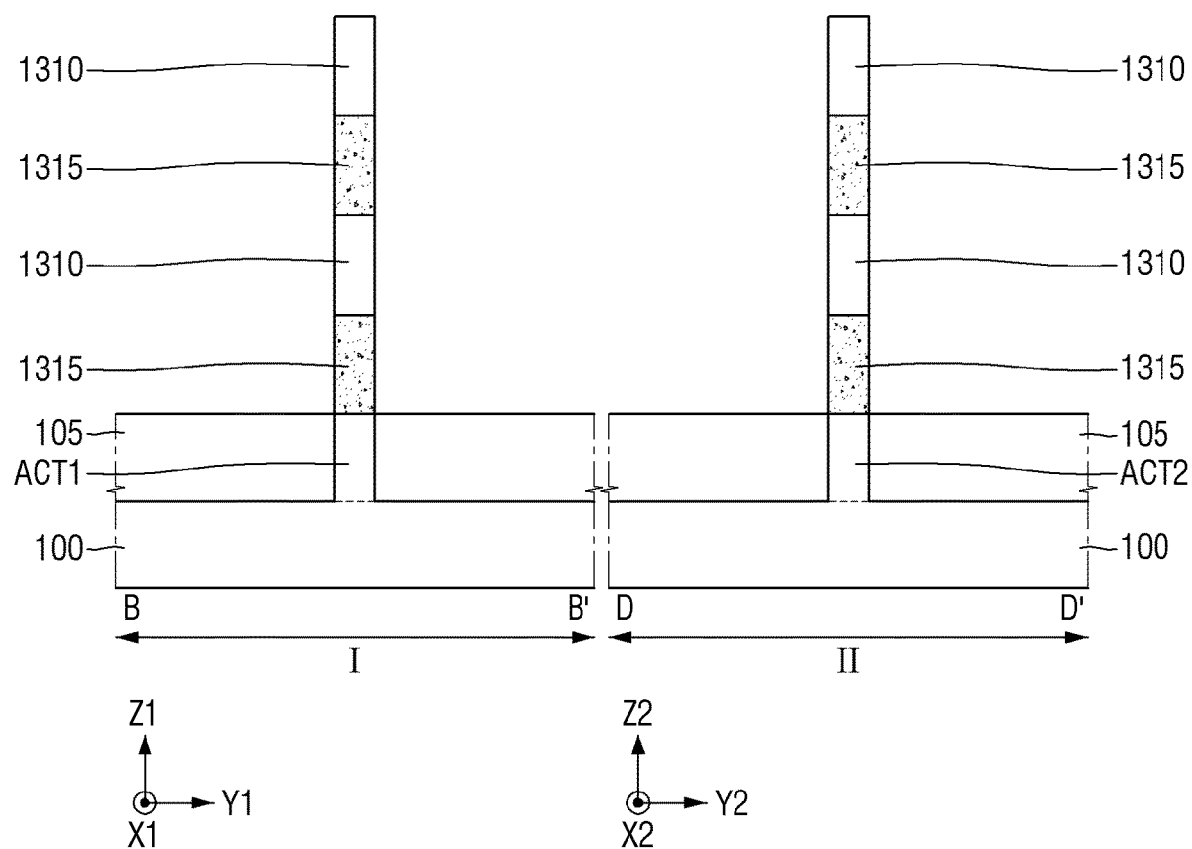
Figure 39:
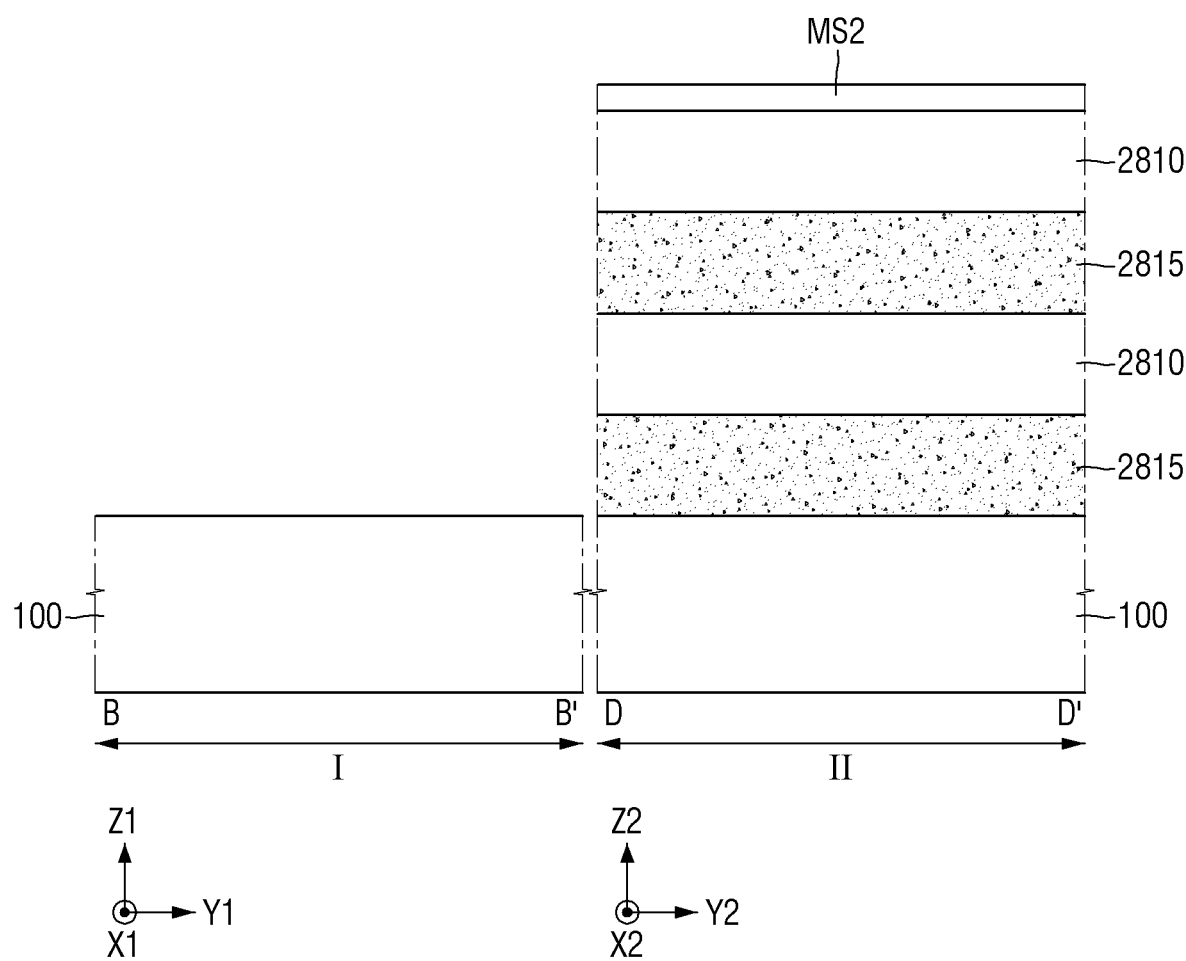
FIGS. 39 and 40 are intermediate phase diagrams for explaining a method of forming active patterns of different heights in the first region and the second region of the substrate.
Figure 40:
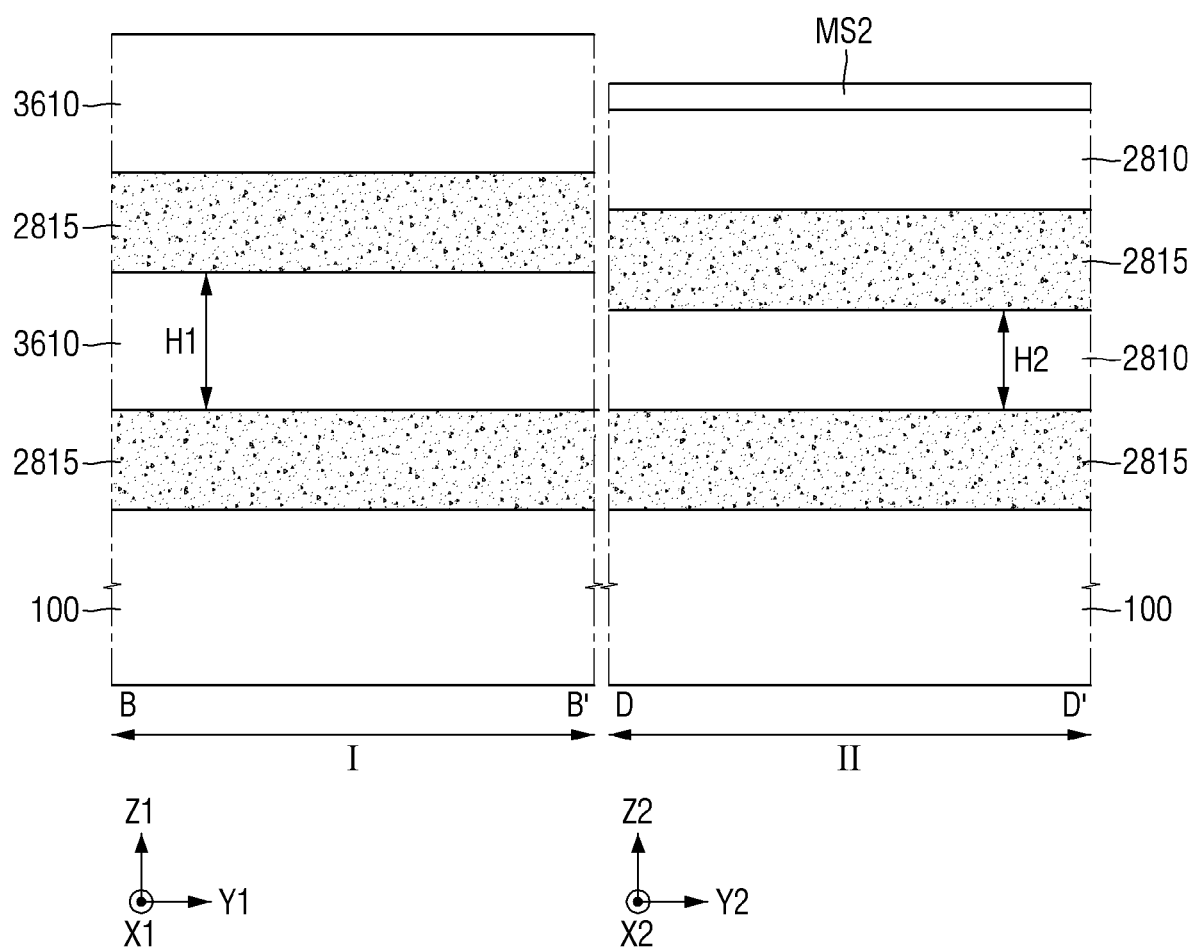

FIGS. 39 and 40 are intermediate phase diagrams for explaining a method of forming active patterns of different heights in the first region and the second region of the substrate. Referring to FIGS. 32, 39 and 40, a sacrificial layer 2815 and a first semiconductor layer 2810 are formed on the first region I and the second region II of the substrate 100, and a second mask MS2 is formed on the second region II. Subsequently, the sacrificial layer 2815 and the first semiconductor layer 2810 formed in the first region I are removed, and the sacrificial layer 2815 and the second semiconductor layer 3610 are formed to be alternately stacked. At this time, the first height H1 of the second semiconductor layer 3610 may be greater than the second height H2 of the first semiconductor layer 2810. On the other hand, the heights of the sacrificial layers 2815 formed in the first region I and the second region II may be substantially the same. Subsequent processes are performed to fabricate the semiconductor device according to some embodiments.

Figure 41:
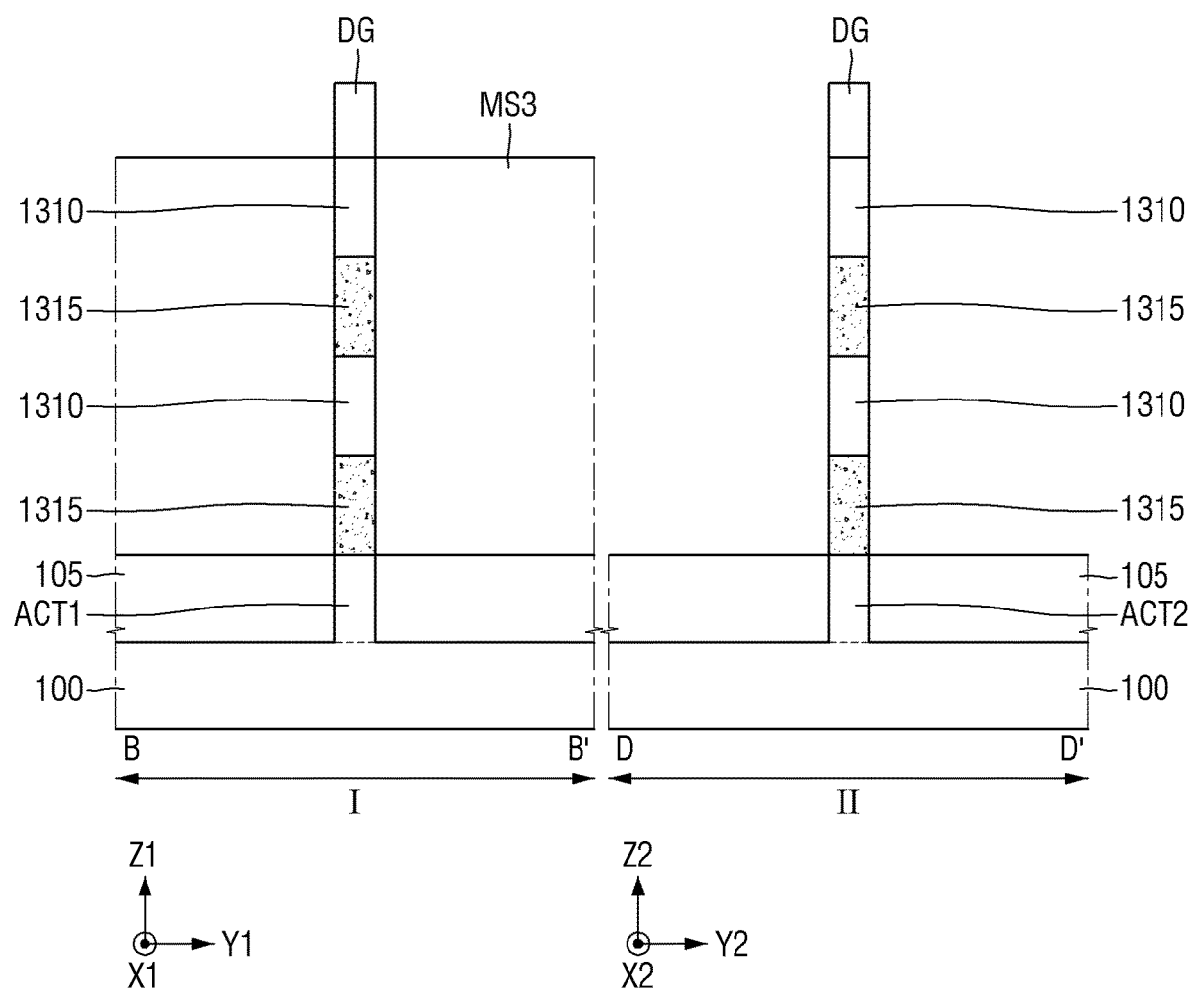
FIGS. 41 and 42 are intermediate stage diagrams for explaining a method of forming third to sixth active patterns.
Figure 42:
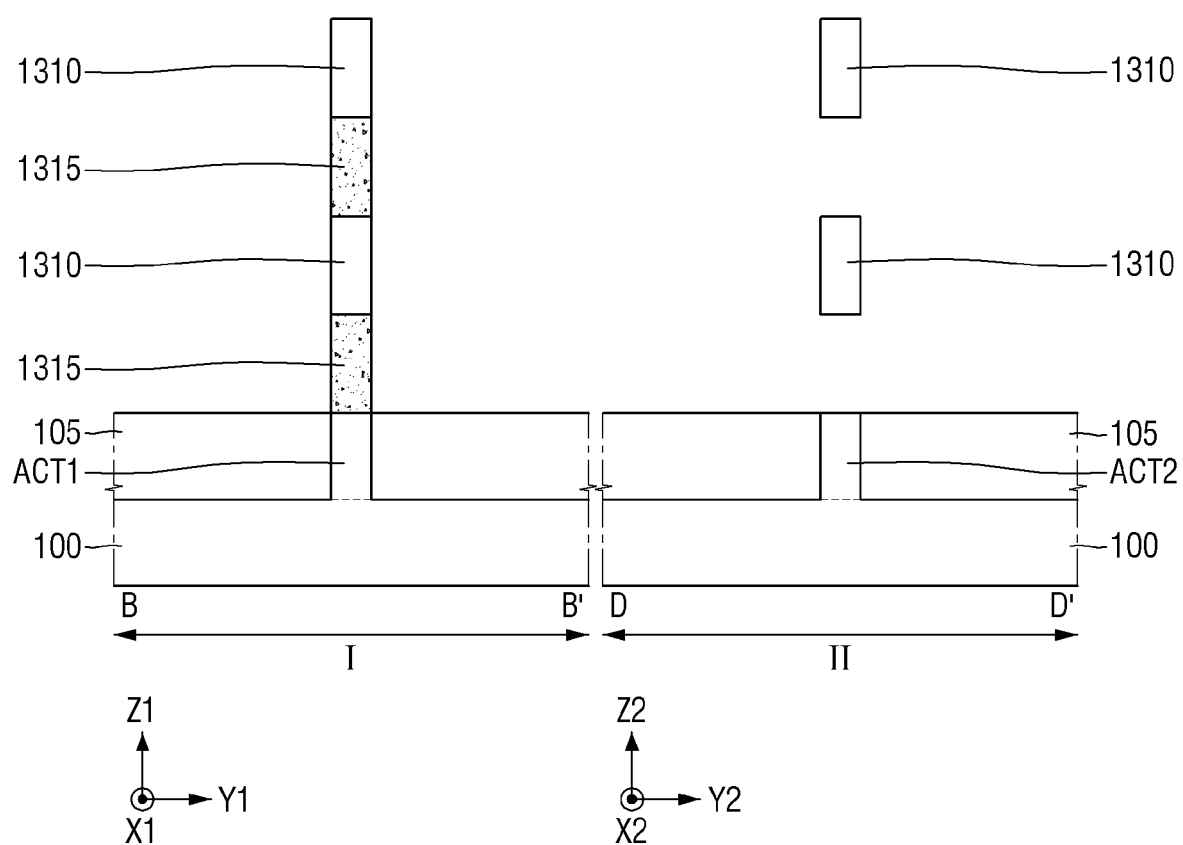

FIGS. 41 and 42 are intermediate stage diagrams for explaining the method of forming the third to sixth active patterns. Referring to FIGS. 34, 41 and 42, before removing the dummy gate structure DG, a third mask MS3 is formed on the first region I of the substrate. At this time, the height from the upper surface of the substrate 100 to the upper surface of the third mask MS3 may be greater than or equal to the height from the upper surface of the substrate 100 to the upper surface of the second semiconductor pattern 1315 of the uppermost layer. In other words, the third mask MS3 may protect the second semiconductor pattern 1315 of the first region I from being etched. Subsequently, the second semiconductor pattern 1315 of the second region II is removed. At this time, the first semiconductor pattern 1310 left in the second region II may correspond to the fourth active pattern 120 and the fifth active pattern 125. The third mask MS3 is removed, and the subsequent processes are performed to fabricate the semiconductor device according to some embodiments.

In concluding the detailed description, those skilled in the art will appreciate that many variations and modifications may be made to the example embodiments without substantially departing from the principles of the present inventive concepts. Therefore, the disclosed example embodiments of the present inventive concepts are used in a generic and descriptive sense only and not for purposes of limitation.

What is claimed is:

1. A semiconductor device comprising:
   a substrate;
   a first gate structure extending in a first direction, in a first region of the substrate;
   first active patterns penetrating through the first gate structure and having a first width in the first direction and a first height in a second direction, the first width being smaller than the first height;
   a first source/drain region electrically connected to the first active patterns;
   a second gate structure extending in a third direction, in a second region of the substrate;
   second active patterns penetrating through the second gate structure and having a second width in the third direction and a second height in a fourth direction, the second height being different from the first height;
   a second source/drain region electrically connected to the second active patterns; and
   a first spacer between the second gate structure and the second source/drain region, and between the second active patterns and the substrate, and including the same material as the second source/drain region,
   wherein the first spacer is not between the first gate structure and the first source/drain region, and is not between the first active patterns and the substrate, and
   wherein the number of the first active patterns is equal to the number of the second active patterns.

2. The semiconductor device of claim 1,
   wherein the first gate structure comprises a first gate insulating film extending around the first active patterns, and a first gate electrode on the first gate insulating film,
   wherein a sidewall of the first gate structure that faces the first source/drain region is longer in the second direction than in the first direction,
   wherein the second gate structure comprises a second gate insulating film extending around the second active patterns, and a second gate electrode on the second gate insulating film, and
   wherein a sidewall of the second gate structure that faces the second source/drain region is longer in the fourth direction than in the third direction.

3. The semiconductor device of claim 1,
   wherein the first active patterns include a first sub active pattern and a second sub active pattern spaced apart from the first sub active pattern in the second direction and penetrating through the first gate structure; and
   wherein the second active patterns include a third sub active pattern and a fourth sub active pattern spaced apart from the third sub active pattern in the fourth direction and penetrating through the second gate structure.

4. The semiconductor device of claim 3, wherein a first distance between the first sub active pattern and the second sub active pattern is equal to a second distance between the third sub active pattern and the fourth sub active pattern.

5. The semiconductor device of claim 1,
wherein the first active patterns include a first sub active pattern and a second sub active pattern spaced apart from the first sub active pattern in the first direction and penetrating through the first gate structure.

6. The semiconductor device of claim 5,
wherein the second active patterns include a third sub active pattern and a fourth active pattern spaced apart from the third sub active pattern in the third direction and penetrating through the second gate structure.

7. The semiconductor device of claim 1,
a third source/drain region spaced apart from the first source/drain region and electrically connected to the first active patterns,
wherein a first thickness of the first source/drain region in the second direction is different from a second thickness of the third source/drain region in the second direction.

8. The semiconductor device of claim 7,
wherein the first active patterns include a first sub active pattern and a second sub active pattern spaced apart from the first sub active pattern in the second direction and penetrating through the first gate structure,
wherein the first source/drain region is in contact with the first sub active pattern and the second sub active pattern, and
wherein the third source/drain region is in contact with the first active sub pattern and is not in contact with the second sub active pattern.

9. The semiconductor device of claim 1, wherein the second width is greater than the second height.

10. The semiconductor device of claim 9,
wherein the first active patterns include a first sub active pattern and a second sub active pattern penetrating through the first gate structure on the first active patterns;
wherein the second active patterns include a third sub active pattern and a fourth sub active pattern penetrating through the second gate structure on the second active patterns; and
wherein the second active patterns further include a fifth sub active pattern penetrating through the second gate structure on the fourth sub active pattern.

11. The semiconductor device of claim 10, wherein a first distance between a lower surface of the first sub active pattern and an upper surface of the second sub active pattern is equal to a second distance between a lower surface of the third sub active pattern and an upper surface of the fifth sub active pattern.

12. The semiconductor device of claim 9,
wherein the second width is equal to the first height, and
wherein the second height is equal to the first width.

13. The semiconductor device of claim 1, wherein the second width is smaller than the second height, and the second height is smaller than the first height.

14. A semiconductor device comprising:
a substrate including first and second regions;
a first gate structure extending in a first direction, in the first region;
a first active pattern intersecting the first gate structure and having a first width in the first direction and a first height in a second direction, the first width being smaller than the first height, wherein the first active pattern is an active pattern of a PMOS transistor;
a first source/drain region electrically connected to the first active pattern;
a second gate structure extending in a third direction, in the second region;
a second active pattern penetrating through the second gate structure and having a second width in the third direction and a second height in a fourth direction, the second width being smaller than the second height, and the second height being smaller than the first height, wherein the second active pattern is an active pattern of an NMOS transistor; and
a second source/drain region electrically connected to the second active pattern,
wherein an upper surface of the first source/drain region is higher than an upper surface of the second source/drain region.

15. The semiconductor device of claim 14,
wherein a sidewall of the first gate structure that faces the first source/drain region is longer in the second direction than in the first direction, and
wherein the first gate structure comprises a gate structure of a nanosheet transistor.

16. The semiconductor device of claim 15,
wherein the first gate structure comprises a first gate insulating film extending along a sidewall of the first active pattern, and a first gate electrode on the first gate insulating film, and
wherein the second gate structure comprises a second gate insulating film extending around the second active pattern, and a second gate electrode on the second gate insulating film.

17. The semiconductor device of claim 15, wherein the first active pattern comprises first and second semiconductor patterns alternately stacked.

18. The semiconductor device of claim 14, further comprising:
a third active pattern spaced apart from the first active pattern in the second direction and intersecting the first gate structure,
wherein the third active pattern is another active pattern of the PMOS transistor.

19. A semiconductor device comprising:
a substrate;
first and second active patterns extending in a first direction on the substrate and having a width in a second direction and a height in a third direction, the first and second active patterns being spaced apart from each other in the third direction by a distance;
a gate structure extending in the second direction and intersecting the first and second active patterns, wherein the gate structure is between the substrate and the first active pattern, between the first active pattern and the second active pattern, and on the second active pattern;
a source/drain region electrically connected to the first and second active patterns; and
a source/drain contact electrically connected to the source/drain region, extending in the third direction, and not overlapping the first and second active patterns in the first direction,
wherein the width is smaller than the height, and
wherein, in a cross section taken along the second direction, a distance between an upper surface of the substrate and the first active pattern is equal to a distance between the first active pattern and the second active pattern.

20. The semiconductor device of claim 19, wherein the source/drain contact includes a contact layer in contact with the source/drain region, a metal barrier on the contact layer, and metal material in a region defined by the contact layer and the metal barrier.

* * * * *